(12) United States Patent
Zhang et al.

(10) Patent No.: US 11,799,398 B2
(45) Date of Patent: Oct. 24, 2023

(54) WIDEBAND PIEZOELECTRIC VIBRATORY MEMS HARVESTER

(71) Applicant: Memorial University of Newfoundland, St. John's (CA)

(72) Inventors: Lihong Zhang, St. John's (CA); Seyedfakhreddin Nabavi, St. John's (CA)

(73) Assignee: Memorial University of Newfoundland, St. John's (CA)

( * ) Notice: Subject to any disclaimer, the term of this patent is extended or adjusted under 35 U.S.C. 154(b) by 452 days.

(21) Appl. No.: 17/051,307

(22) PCT Filed: May 3, 2019

(86) PCT No.: PCT/CA2019/050588
§ 371 (c)(1),
(2) Date: Oct. 28, 2020

(87) PCT Pub. No.: WO2019/210425
PCT Pub. Date: Nov. 7, 2019

(65) Prior Publication Data
US 2021/0135601 A1 May 6, 2021

Related U.S. Application Data

(60) Provisional application No. 62/666,984, filed on May 4, 2018.

(51) Int. Cl.
*H02N 2/18* (2006.01)
*H02N 2/00* (2006.01)
(Continued)

(52) U.S. Cl.
CPC ............. *H02N 2/188* (2013.01); *H02N 2/22* (2013.01); *H10N 30/06* (2023.02);
(Continued)

(58) Field of Classification Search
CPC .... H02N 2/188; H10N 30/306; H10N 30/853; H01N 30/877
See application file for complete search history.

(56) References Cited

U.S. PATENT DOCUMENTS

| | | |
|---|---|---|
| 2008/0074002 A1 | 3/2008 | Priya et al. |
| 2012/0206016 A1 | 8/2012 | Ayazi et al. |
| | (Continued) | |

FOREIGN PATENT DOCUMENTS

| | | |
|---|---|---|
| CN | 203278696 U | 11/2013 |
| WO | 2017/009660 A1 | 1/2017 |

OTHER PUBLICATIONS

Global Dossier of U.S. Appl. No. 17/051,307, filed 2023.*
(Continued)

*Primary Examiner* — Bryan P Gordon
(74) *Attorney, Agent, or Firm* — BERESKIN & PARR LLP/S.E.N.C.R.L. s.r.l; Tonino Rosario Orsi

(57) ABSTRACT

Several types of piezoelectric MEMS vibration energy harvesters are described herein as well as methods of fabricating the vibration energy harvesters. The vibration energy harvesters generally comprise a serpentine structure having a central longitudinal axis; a piezoelectric film deposited on a surface of the serpentine structure; a central mass located at a mid-portion of the central longitudinal axis; two lateral masses positioned at opposing corners of the serpentine structure; anchor points at two other opposing corners of the serpentine structure; and upper and lower electrode layers. The energy harvesters have a 180 degree rotational symmetry about the central mass and when the serpentine structure experiences a strain, the piezoelectric film generates a voltage. The geometry of the energy harvesters allows for lower frequency and wider bandwidth operation as well as higher power density.

41 Claims, 20 Drawing Sheets

(51) Int. Cl.
H10N 30/06 (2023.01)
H10N 30/076 (2023.01)
H10N 30/082 (2023.01)
H10N 30/30 (2023.01)
H10N 30/853 (2023.01)
H10N 30/87 (2023.01)

(52) U.S. Cl.
CPC ......... H10N 30/076 (2023.02); H10N 30/082 (2023.02); H10N 30/306 (2023.02); H10N 30/853 (2023.02); H10N 30/877 (2023.02)

(56) References Cited

U.S. PATENT DOCUMENTS

| | | | |
|---|---|---|---|
| 2013/0207520 A1 | 8/2013 | Near | |
| 2015/0358737 A1* | 12/2015 | Yang | H02N 2/186 367/180 |
| 2016/0156287 A1* | 6/2016 | Yang | H10N 30/306 310/339 |
| 2017/0077839 A1* | 3/2017 | Karami | H10N 30/306 |
| 2017/0084815 A1* | 3/2017 | Choo | H10N 30/306 |
| 2017/0264215 A1* | 9/2017 | Varghese | H10N 30/306 |

OTHER PUBLICATIONS

Zhao et al., "Synergy of wind energy harvesting and synchronized switch harvesting interface circuit," IEEE/ASME Trans. Mechatronics, 2017, vol. 22, No. 2, pp. 1093-1103.
Song et al., "Road energy harvester designed as a macro-power source using the piezoelectric effect," Int. J. Hydrogen Energy, 2016, vol. 41, No. 29, pp. 12563-12568.
Geisler et al., "Human-motion energy harvester for autonomous body area sensors," Smart Mater. Struct., 2017, vol. 26, No. 3, p. 35028 (12 pages).
Nabavi et al., "Portable Wind Energy Harvesters for Low-Power Applications: A Survey," Sensors, 2016, 16(7): 1101, pp. 1-31.
Wang et al., "Design, Fabrication, and Characterization of Scandium Aluminum Nitride-Based Piezoelectric Micromachined Ultrasonic Transducers," J. Microelectromechanical Syst., 2017, vol. 26, No. 5, pp. 1132-1139.
Kim et al., "A review of piezoelectric energy harvesting based on vibration," Int. J. Precis. Eng. Manuf., 2011, vol. 12, No. 6, pp. 1129-1141.
Abdelkefi et al., "Modeling, validation, and performance of low-frequency piezoelectric energy harvesters," J. Intell. Mater. Syst. Struct., 2014, vol. 25, No. 12, pp. 1429-1444.
Sunithamani et al., "PZT length optimization of MEMS piezoelectric energy harvester with a non-traditional cross section: simulation study," Microsyst. Technol., 2014, vol. 20, No. 12, pp. 2165-2171.
Sordo et al., "Optimization method for designing multimodal piezoelectric MEMS energy harvesters," Microsyst. Technol., 2016, vol. 22, No. 7, pp. 1811-1820.
Senturia et al., Chapter 7 in "Microsystem Design," Springer Science & Business Media, Kluwer Academic Publishers, New York, 2002, pp. 164-165.
Zhang et al., "Effect of cubic nonlinearity on auto-parametrically amplified resonant MEMS mass sensor," Sensors Actuators A Phys., 2002, vol. 102, No. 1, pp. 139-150.
Deb et al., "An evolutionary many-objective optimization algorithm using reference-point-based nondominated sorting approach, part I: Solving problems with box constraints.," IEEE Trans. Evol. Comput., 2014, vol. 18, No. 4, pp. 577-601.
Davis ed., Chapter 1 in "Handbook of genetic algorithms," 1991, pp. 1-22.
Meitzler et al., Chapter 2 in "IEEE standard on piezoelectricity," Society, 1988, pp. 4-7.
Chidambaram et al., "Measurement of effective piezoelectric coefficients of PZT thin films for energy harvesting application with interdigitated electrodes," IEEE Trans. Ultrason. Ferroelectr. Freq. Control, 2012, vol. 59, No. 8, pp. 1624-1631.
Park et al., "Tensile and high cycle fatigue test of Al-3% Ti thin films," Sensors Actuators A, 2008, vol. 147, No. 2, pp. 561-569.
"Fatigue Module," COMSOL Inc., webpage, 2016 <https://web.archive.org/web/20160804011206/https://www.comsol.com/fatigue-module> (6 pages).
Rezaeisaray, Chapter 3 in "Investigation of Potential Platforms for Low Frequency MEMS-based Piezoelectric Energy Harvesting," PhD thesis, Dept. of Mechanical Engineering, University of Alberta, 2014, pp. 34-39.
Cammarano et al., "The bandwidth of optimized nonlinear vibration-based energy harvesters," Smart Mater. Struct., 2014, 23(5): 55019, pp. 1-9.
Kong et al., "Resistive impedance matching circuit for piezoelectric energy harvesting," J. Intell. Mater. Syst. Struct., 2010, 21: 1293-1302.
Horowitz et al., "A MEMS acoustic energy harvester," J. Micromechanics Microengineering, 2006, 16(9): S174 to S181.
Song et al., "Ultra-Low Resonant Piezoelectric MEMS Energy Harvester With High Power Density," J. Microelectromechanical Syst., 2017, vol. 26, No. 6, pp. 1226-1234.
Nguyen et al., "Fabrication and characterization of a wideband MEMS energy harvester utilizing nonlinear springs," J. Micromechanics Microengineering, 2010, 20(12): 125009, pp. 1-11.
Zhang et al., "Micro electrostatic energy harvester with both broad bandwidth and high normalized power density," Appl. Energy, 2018, vol. 212, pp. 362-371.
Liu et al., "A multi-frequency vibration-based MEMS electromagnetic energy harvesting device," Sensors Actuators A Phys., 2013, vol. 204, pp. 37-43.
Mallick et al., "A nonlinear stretching based electromagnetic energy harvester on FR4 for wideband operation," Smart Mater. Struct., 2014, 24(1): 15013, pp. 1-14.
Wang et al., "ALN wideband energy harvesters with wafer-level vacuum packaging utilizing three-wafer bonding," in Proc. IEEE 30th Micro Electro Mechanical Systems (MEMS), 2017, pp. 841-844.
Leadenham et al., "Nonlinear M-shaped broadband piezoelectric energy harvester for very low base accelerations: primary and secondary resonances," Smart Mater. Struct., 2015, 24(5): 55021, pp. 1-14.
Aktakka et al., "Three-axis piezoelectric vibration energy harvester," in Proc. IEEE 28th Micro Electro Mechanical Systems (MEMS), 2015, pp. 1141-1144.
Liu et al., "Piezoelectric MEMS energy harvester for low-frequency vibrations with wideband operation range and steadily increased output power," Microelectromechanical Syst. J., 2011, vol. 20, No. 5, pp. 1131-1142.
Liu et al., "Piezoelectric MEMS-based wideband energy harvesting systems using a frequency-up-conversion cantilever stopper," Sensors Actuators A, 2012, vol. 186, pp. 242-248.
Rezaeisaray et al., "Low frequency piezoelectric energy harvesting at multi vibration mode shapes," Sensors Actuators A, 2015, vol. 228, pp. 104-111.
Liu et al., "A MEMS-based piezoelectric power generator array for vibration energy harvesting," Microelectronics J., 2008, 39(5): 802-806.
Sari et al., "An electromagnetic micro power generator for wideband environmental vibrations," Sensors Actuators A Phys., 2008, 145-146: 405-413.
Xiao et al., "Energy harvester array using piezoelectric circular diaphragm for broadband vibration," Appl. Phys. Lett., 2014, 104(22): 223904-1 to 223904-4.
Zhou et al., "An efficient vibration energy harvester with a multi-mode dynamic magnifier," Smart Mater. Struct., 2012, 21(1): 15014, pp. 1-9.
Dhakar et al., "A new energy harvester design for high power output at low frequencies," Sensors Actuators A Phys., 2013, vol. 199, pp. 344-352.
Harne et al., "A review of the recent research on vibration energy harvesting via bistable systems," Smart Mater. Struct., 2013, 22(2): 23001, pp. 1-12.

(56) References Cited

OTHER PUBLICATIONS

Tang et al., "Two-stage wideband energy harvester driven by multimode coupled vibration," IEEE/ASME Trans. Mechatronics, 2015, 20(1): 115-121.
Schumacher, "Energy Harvesting for Wearables", Wearable Technologies, 2014 <https://www.wearable-technologies.com/2014/07/energy-harvesting-for-wearables> (3 pages).
International Search Report and Written Opinion dated Jul. 15, 2019 in International Patent Application No. PCT/CA2019/050588 (10 pages).
Nabavi et al., "Design and Optimization of Wideband Multimode Piezoelectric MEMS Vibration Energy Harvesters," Proceedings, 1, 586, pp. 1-4, 2017.
Du et al., "A new electrode design method in piezoelectric vibration energy harvesters to maximize output power," Sensors & Actuators: A Physical, 2017, 263: 693-701.
Nabavi et al., "Design and Optimization of Piezoelectric MEMS Vibration Energy Harvesters Based on Genetic Algorithm," IEEE Sensors Journal, 2017, 17(22): 7372-7382.
Nabavi et al., "Design and Optimization of MEMS Piezoelectric Energy Harvesters for Improved Efficiency," IEEE Sensors, 2017, Glasgow, UK (3 pages).
Tanaka et al., "Design Optimization of Electromagnetic MEMS Energy Harvester with Serpentine Coil," 2013 IEEE International Conference on Green Computing and Communications and IEEE Internet of Things and IEEE Cyber, Physical and Social Computing, Beijing, China, pp. 1656-1658.

* cited by examiner

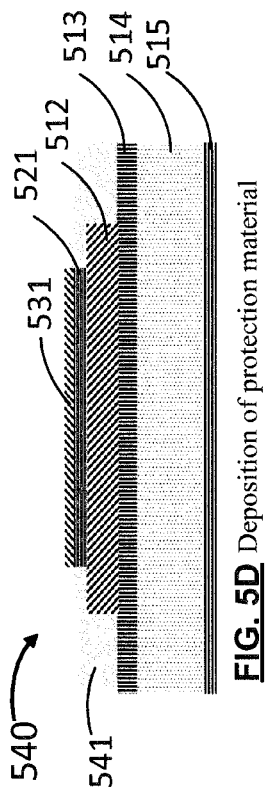
FIG. 5A Deposition of PSG
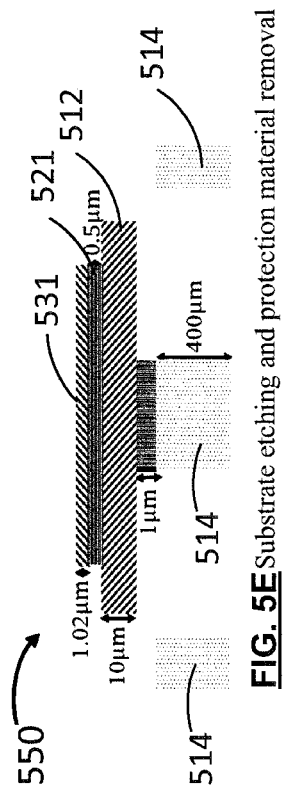
FIG. 5B Deposition of piezoelectric layer
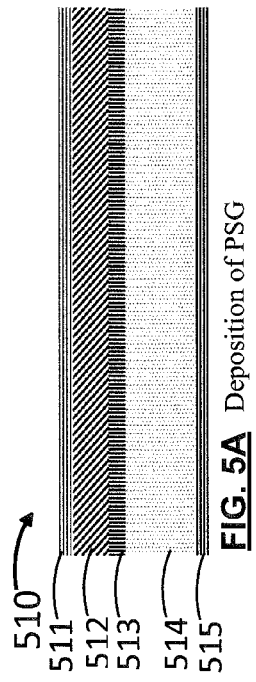
FIG. 5C Si etching and deposition of top electrode
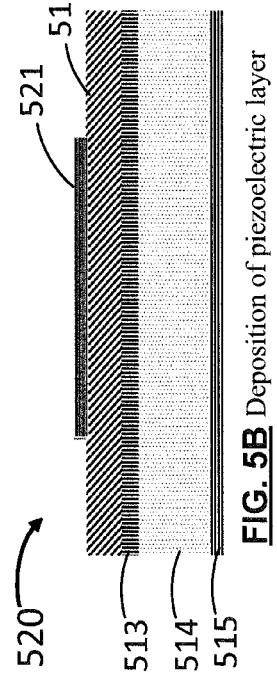
FIG. 5D Deposition of protection material
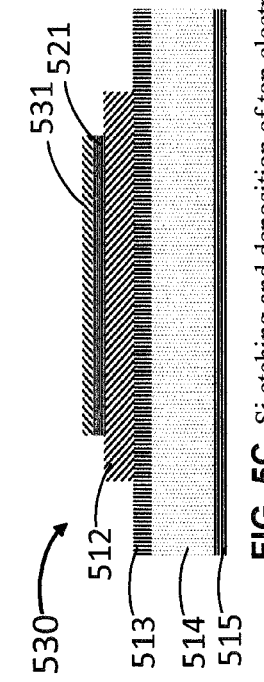
FIG. 5E Substrate etching and protection material removal
FIG. 5F A top view of fabricated piezoelectric harvester

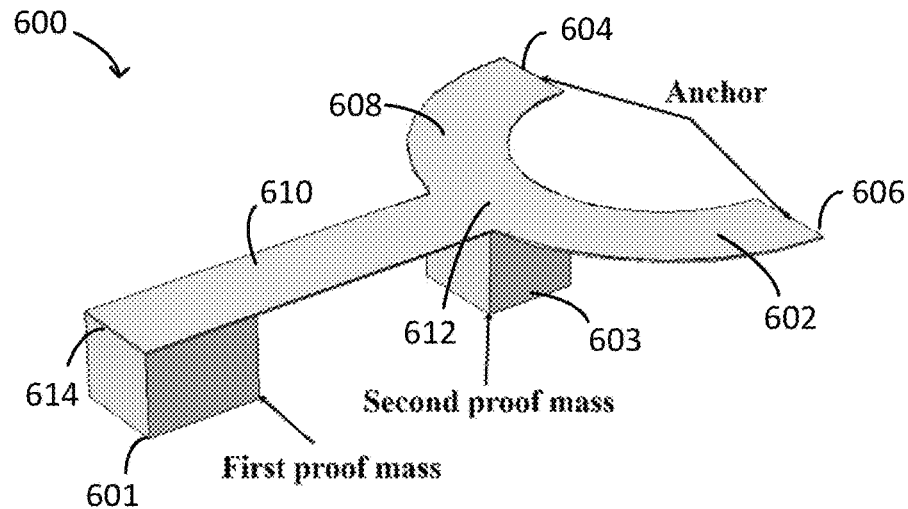
FIG. 9A
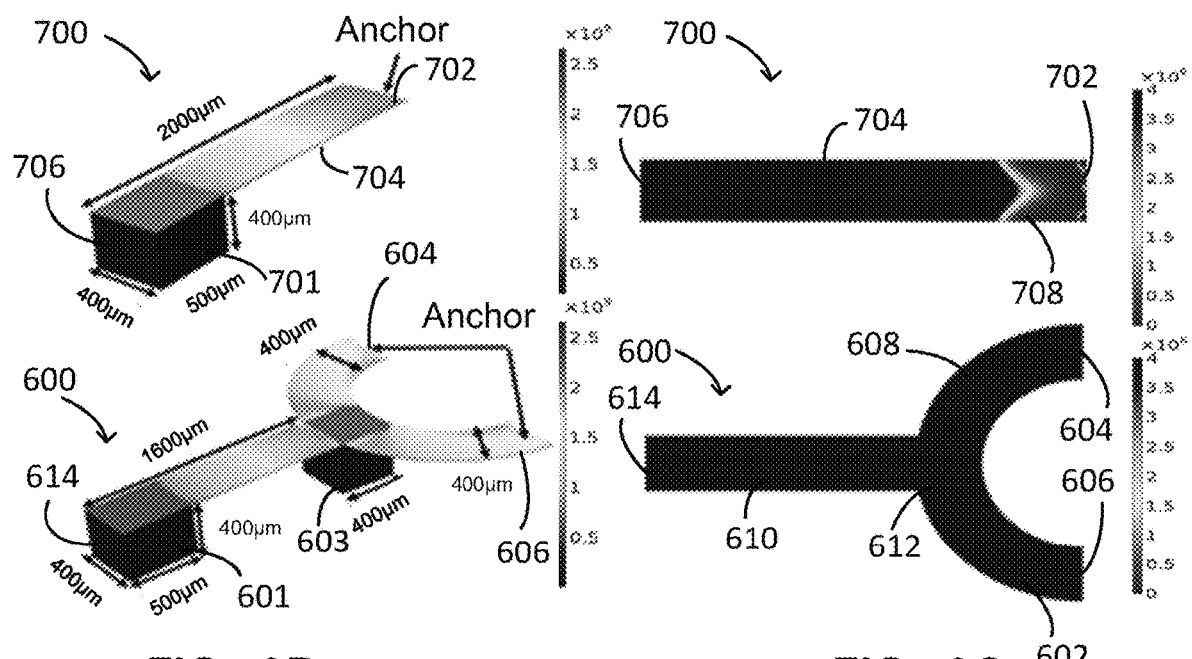
FIG. 9B
FIG. 9C

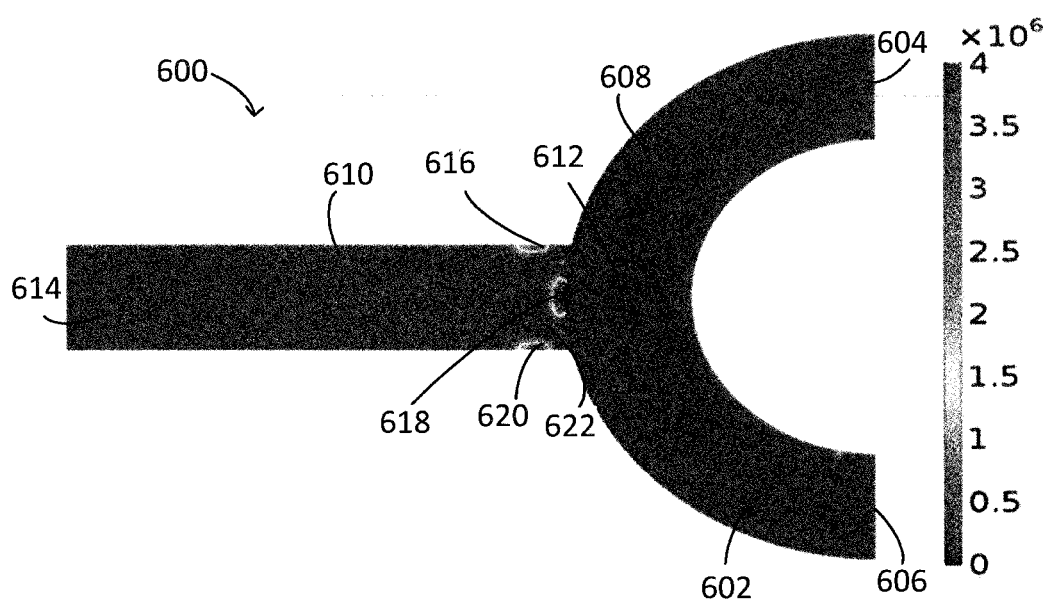
FIG. 9D
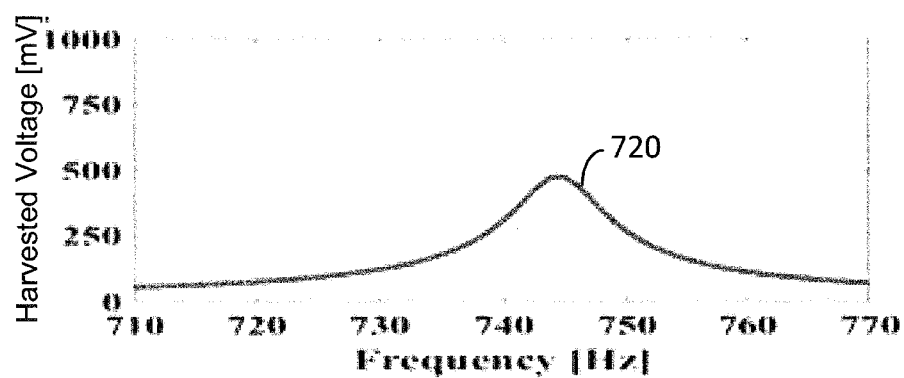
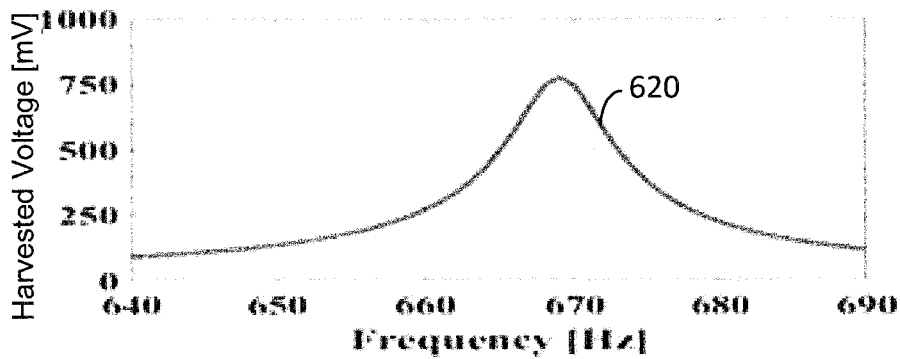
FIG. 9E

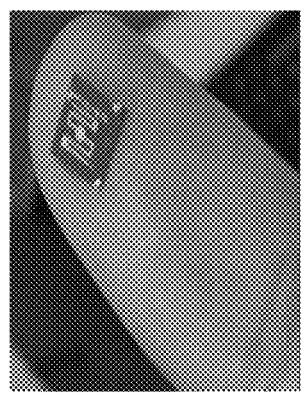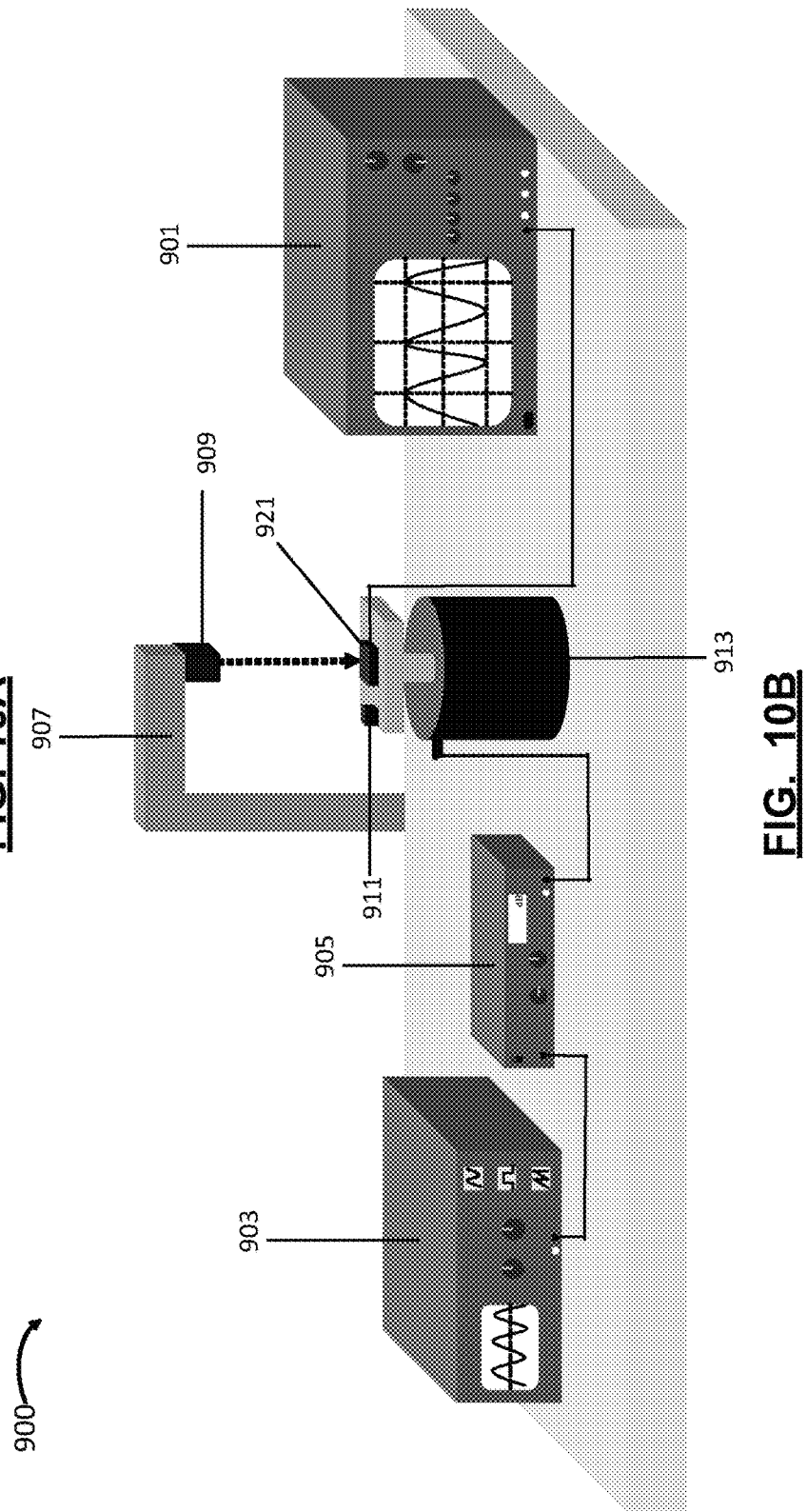

US 11,799,398 B2

WIDEBAND PIEZOELECTRIC VIBRATORY MEMS HARVESTER

CROSS-REFERENCE TO RELATED APPLICATION

This Application is a 35 USC § 371 national stage entry of International Patent Application No. PCT/CA2019/050588 filed May 3, 2019, which claims the benefit of U.S. Provisional Patent Application No. 62/666,984 filed May 4, 2018; the contents of each of which are hereby incorporated herein in their entirety.

FIELD

Various embodiments are described herein that generally relate to an energy harvester, and in particular to an energy harvester having a structure with a mass distribution that can generate a voltage when subjected to a strain.

BACKGROUND

Among the available resources for energy harvesting by microelectromechanical systems (MEMS), the vibrations, which can be produced by wind blowing [1], road traffic [2], human motions [3], etc., have gained higher attention due to their high power density, ease of trapping, and ubiquity [4]. This involves capturing ambient vibration (i.e. kinetic energy) by using a mechanical resonator and then converting the kinetic energy to electricity. The phrase "ease of trapping" means that the kinetic energy of vibration can be collected by using a very simple mechanical resonator such that only a simple aeroelastic flutter is required.

Normally, the kinetic energy of vibrations can be converted to electricity by using the techniques involving electrostatics, electromagnetics, and piezo-electricity. Each technique has its own distinct advantages as well as disadvantages. Among the alternatives, the piezoelectric-based technique dedicated to MEMS vibration energy harvesters is appealing since the used piezoelectric materials are compatible with the micro-machining process and it typically only needs a relatively simple mechanical structure [5].

Ordinarily, MEMS piezoelectric energy harvesters comprise a cantilever and a proof mass at the tip location. These types of harvesters, which operate on a single-degree-of-freedom (SDOF), can be modeled by using a spring-mass system [6]. Although such a simple mechanical structure makes the fabrication process easier, it has a very narrow operational bandwidth [7]. Consequently, any variation in the ambient vibration frequency, which may occur in the real environment, would dramatically reduce the harvesting efficiency.

A feasible solution to enlarging the operational bandwidth of the piezoelectric MEMS harvesters is to utilize multiple piezoelectric cantilevers that have different operational frequencies and are arranged as an array. Therefore, at each particular frequency at least one cantilever is capable of generating electrical voltage. Since such a method requires a large silicon area, the overall harvester power density is relatively low. Accordingly, there is a need for the MEMS energy harvesters to be able to operate in a wide range of frequencies with a considerable amount of power efficiency/density.

SUMMARY OF VARIOUS EMBODIMENTS

In one aspect, in accordance with the teachings herein, there is provided an energy harvester comprising at least one energy harvester stage, where each energy harvester stage comprises: a serpentine structure having: a mid-portion having a longitudinal axis; a first serpentine portion extending from a first end of the mid-portion of the serpentine structure; and a second serpentine portion extending from a second end of the mid-portion of the serpentine structure, the first and second serpentine portions comprising a plurality of beams where sequential beams have varying lengths and/or orientations; a center mass disposed at a central region of the mid-portion of the serpentine structure; a first lateral mass disposed in the first serpentine portion; a second lateral mass disposed in the second serpentine portion; a layer of piezoelectric material deposited on a surface of the serpentine structure; and top and bottom electrode layers for harvesting the generated voltage, the top electrode layer comprising a plurality of electrodes located at different sections of the top electrode layer, wherein, during use, when a section of the serpentine structure experiences a strain the piezoelectric layer at the section generates a voltage.

In at least one embodiment, the first and second lateral masses are disposed at first and second sides of the first and second serpentine portions about the center mass to provide a uniform mass distribution.

In at least one embodiment, the serpentine structure has two ends that provide first and second anchors at first and second opposite corners of the serpentine structure, the first and second lateral masses are positioned at third and fourth opposite corners of the serpentine structure and the first and second lateral masses are coupled to the first and second anchors with first and second beams, respectively.

In at least one embodiment, the first and second serpentine portions along with the first and second lateral masses have a 180 degree rotational symmetry about the center mass.

In at least one embodiment, the beams and piezoelectric material provide piezoelectric cantilevers for the energy harvester.

In at least one embodiment, the beams have a uniform width in the serpentine structure.

In at least one embodiment, the beams of the mid-portion of the serpentine structure are coupled to opposite sides of the center mass and have a smaller width than the diameter of the center mass.

In at least one embodiment, the layer of piezoelectric material is isotropic.

In at least one embodiment, the top electrode layer comprises a first electrode that covers a first half of the serpentine structure and a second electrode that covers a second half of the serpentine structure.

In at least one embodiment, the top electrode layer comprises a center electrode that covers the mid-portion of the serpentine structure and adjacent portions of the first and second serpentine portions, a rightmost electrode adjacent to the center electrode and covering a remaining portion of the first serpentine structure, and a leftmost electrode adjacent to the center electrode and covering a remaining portion of the second serpentine structure.

In at least one embodiment, the top electrode layer comprises six adjacent electrodes covering the energy harvester.

In at least one embodiment, the distance from the first and second lateral masses to their corresponding anchor points and the size of the first and second lateral masses are selected to reduce the operational frequency of the energy harvester and increase the operational bandwidth of the energy harvester.

In at least one embodiment, the energy harvester comprises a plurality of energy harvester stages that are coupled sequentially and disposed in a horizontal configuration or a vertical configuration.

In at least one embodiment, the energy harvester comprises a plurality of energy harvester stages that are coupled sequentially and disposed in a diagonal configuration.

In at least one embodiment, the energy harvester comprises a plurality of energy harvester stages disposed in a two dimensional array configuration.

In another aspect, in accordance with the teachings herein, there is provided a method of fabricating an energy harvester, wherein the method comprises: doping a wafer with a phosphosilicate glass layer; annealing the wafer to drive the phosphosilicate glass layer into a top surface of the wafer; removing the phosphosilicate glass layer; depositing an aluminum nitride layer on the top surface of the wafer; depositing a metal composite on top of the aluminum nitride layer; applying a protection material on a side of the wafer; and patterning the wafer to define a serpentine structure and masses as defined according to any of the teachings herein.

In at least one embodiment, the wafer comprises a bottom oxide layer, a substrate layer disposed above the bottom, an oxide layer disposed above the substrate layer and a silicon layer disposed above the substrate layer.

In at least one embodiment, the method further comprises applying the protection material on a top surface of silicon layer of the wafer.

In at least one embodiment, the act of doping comprises depositing the phosphosilicate glass layer on a top surface of the wafer.

In at least one embodiment, the method further comprises etching the wafer using Reactive Ion Etching (RIE) or Deep Reactive Ion Etch (DRIE); and removing a bottom layer of the wafer.

In at least one embodiment, the act of annealing the wafer comprises heating the wafer at 1050 degrees Celsius.

In at least one embodiment, the act of annealing the wafer comprises heating the wafer for about 30 minutes to about 2 hours.

In at least one embodiment, the act of annealing the wafer comprises heating the wafer in argon gas.

In at least one embodiment, the act of removing the phosphosilicate glass layer is performed by wet chemical etching.

In at least one embodiment, the act of depositing the aluminum nitride layer is performed by reactive sputtering.

In at least one embodiment, the method further comprises patterning the aluminum nitride layer; etching the patterned aluminum nitride layer; and applying a solvent resist strip on the aluminum nitride layer.

In at least one embodiment, the metal composite layer comprises chrome and aluminum.

In at least one embodiment, the metal composite comprises about 20 nm of chrome and about 1 μm of aluminum.

In at least one embodiment, the method further comprises patterning the metal composite layer on top of the aluminum nitride layer through a liftoff process.

In at least one embodiment, the method further comprises patterning a plurality of electrodes on the top electrode layer.

In at least one embodiment, the method further comprises: selecting a plurality of desired resonant mode frequencies; selecting at least one design constraint; and using a genetic algorithm to optimize two parameters including an anchored beam length which is a distance from two corner masses to their corresponding anchors, and a length of the two corner masses to reduce values of the desired resonant mode frequencies and to reduce a frequency range between adjacent desired resonant mode frequencies In another aspect, in accordance with the teachings herein, there is provided an energy harvester comprising a serpentine structure having a central longitudinal axis; a piezoelectric film deposited on a surface of the serpentine structure; a central mass located at a mid-portion of the central longitudinal axis; first and second lateral masses positioned at first and second opposing corners of the serpentine structure; first and second anchor points at third and fourth opposing corners of the serpentine structure; and upper and lower electrode layers, the upper electrode layer comprising a plurality of electrodes, wherein the energy harvester has a 180 degree rotational symmetry about the central mass and when the serpentine structure experiences a stress, the piezoelectric film generates a voltage.

In at least one embodiment of energy harvesters described herein, the piezoelectric material comprises aluminum nitride (AlN).

In such embodiments, the AlN in the piezoelectric material may have a thickness of about 0.5 μm.

In at least one embodiment of energy harvesters described herein, the harvester comprises a metal composite, which further comprises chrome and aluminum, on top of the AlN.

In at least one embodiment of energy harvesters described herein, the serpentine structure comprises a doubly clamped piezoelectric cantilever.

In at least one embodiment, at least one of the anchors is coupled to a curved anchor, the curved anchor comprising an curved region and one of the ends of the curved region is coupled to the at least one anchor.

In at least one embodiment, the curved anchor further comprises an anchor proof mass.

In at least one embodiment, the anchor proof mass is located at a central region of the curved anchor.

Other features and advantages of the present disclosure will become apparent from the following detailed description taken together with the accompanying drawings. It should be understood, however, that the detailed description and the specific examples, while indicating preferred embodiments of the teachings herein, are given by way of illustration only, since various changes and modifications within the spirit and scope of the teachings herein will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described. The drawings are not intended to limit the scope of the teachings described herein.

FIGS. 5A-5F illustrate schematics of an example embodiment of a micro-fabrication process that can be used to fabricate an energy harvester in accordance with the teachings herein.

FIG. 9A illustrates an example embodiment of a curved-anchor energy harvester in accordance with the teachings herein.

FIGS. 9B and 9C illustrate a comparison of simulated mechanical stress experienced between a conventional harvester and a curved-anchor harvester.

FIG. 9D shows a simulated fatigue lifetime distribution under cyclic mechanical loading for the curved-anchor harvester.

FIG. 9E shows the frequency responses of the conventional and the curve-shaped piezoelectric MEMS energy harvesters under an acceleration magnitude of 1 g.

FIG. 10A illustrates an image of a prototyped (i.e. micro-fabricated) energy harvester in accordance with the teachings herein.

FIG. 10B shows a performance measurement setup for testing prototypes of energy harvesters that are implemented in accordance with the teachings herein.

Figure 1A:
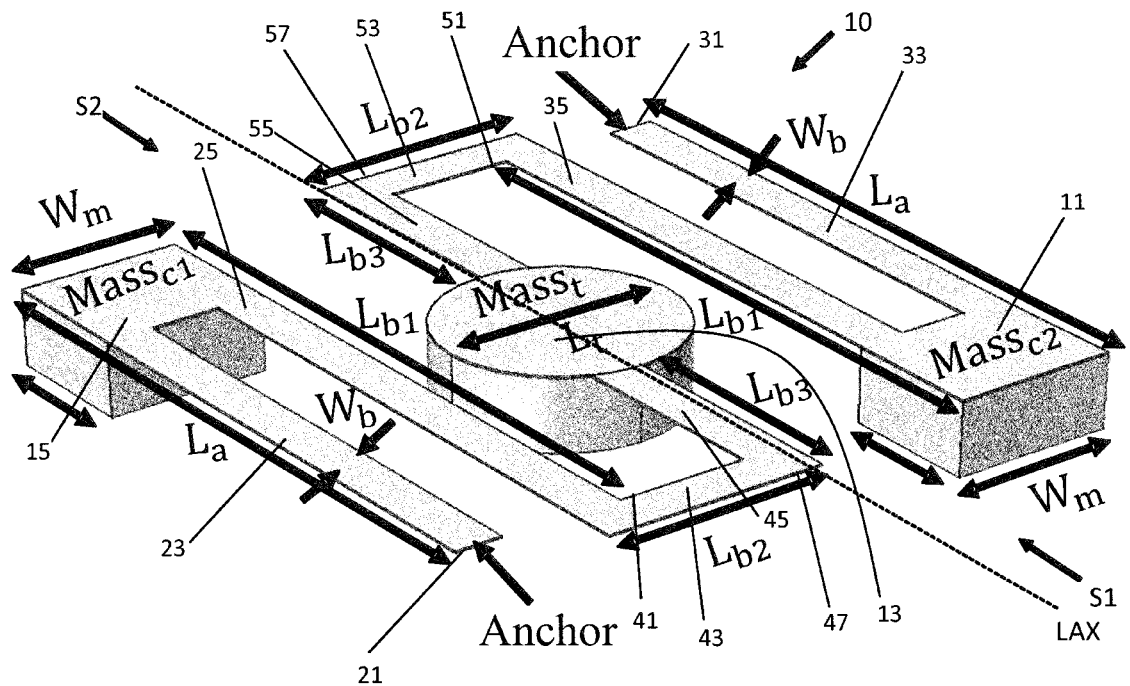
FIG. 1A illustrates an example embodiment of an energy harvester in accordance with the teachings herein.

The skilled person in the art will understand that the drawings, further described below, are for illustration purposes only. The drawings are not intended to limit the scope of the applicant's teachings in any way. Also, it will be appreciated that for simplicity and clarity of illustration, elements shown in the figures have not necessarily been drawn to scale. For example, the dimensions of some of the elements may be exaggerated relative to other elements for clarity. Further aspects and features of the example embodiments described herein will appear from the following description taken together with the accompanying drawings.

DETAILED DESCRIPTION OF THE EMBODIMENTS

Various embodiments in accordance with the teachings herein will be described below to provide an example of at least one embodiment of the claimed subject matter. No embodiment described herein limits any claimed subject matter. The claimed subject matter is not limited to devices, systems or methods having all of the features of any one of the devices, systems or methods described below or to features common to multiple or all of the devices, systems or methods described herein. It is possible that there may be a device, system or method described herein that is not an embodiment of any claimed subject matter. Any subject matter that is described herein that is not claimed in this document may be the subject matter of another protective instrument, for example, a continuing patent application, and the applicants, inventors or owners do not intend to abandon, disclaim or dedicate to the public any such subject matter by its disclosure in this document.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It should also be noted that the terms "coupled" or "coupling" as used herein can have several different meanings depending in the context in which these terms are used. For example, the terms coupled or coupling can have a mechanical or electrical connotation. For example, as used herein, the terms coupled or coupling can indicate that two elements or devices can be directly connected to one another or connected to one another through one or more intermediate elements or devices via an electrical signal, an electrical connection, or a mechanical element depending on the particular context.

It should also be noted that, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that terms of degree such as "substantially", "about" and "approximately" as used herein mean a reasonable amount of deviation of the modified term such that the end result is not significantly changed. These terms of degree may also be construed as including a deviation of the modified term, such as by 1%, 2%, 5% or 10%, for example, if this deviation does not negate the meaning of the term it modifies.

Furthermore, the recitation of numerical ranges by endpoints herein includes all numbers and fractions subsumed within that range (e.g. 1 to 5 includes 1, 1.5, 2, 2.75, 3, 3.90, 4, and 5). It is also to be understood that all numbers and fractions thereof are presumed to be modified by the term "about" which means a variation of up to a certain amount of the number to which reference is being made if the end result is not significantly changed, such as 1%, 2%, 5%, or 10%, for example.

Energy harvesting from ambient vibrations by microelectromechanical systems (MEMS) is recognized as a practical method for providing power to low-power consumer electronics applications. During the last few decades, several attempts have been made to provide piezoelectric MEMS harvesters with the ability of operating in the real environment. However, the conventional MEMS energy harvesters can only generate voltage in a narrow bandwidth and/or at a higher frequency, which is disadvantageous.

The present subject matter relates to various embodiments of piezoelectric MEMS harvesters that are capable of vibrating with multiple degrees-of-freedom, and have enhanced (i.e. widened) operational bandwidth and operate at lower frequencies by reducing the mechanical stiffness and increasing the overall weight. Furthermore, the required magnitude of the input acceleration for triggering energy harvesting is extremely small. This allows at least some of the harvesters described herein to convert ambient vibrations to electricity effectively and efficiently.

In accordance with the teachings herein, the harvester has an eccentric geometry with a 180 degree symmetry and a clamped-clamped (i.e. doubly clamped) cantilever configuration that is associated with three proof masses in three different locations. This geometry has multiple degrees-of-freedom (MDOF), which means that the harvesters with this geometry can harvest voltage at multiple vibration modes (i.e. multi-resonant-frequency modes). Furthermore, the uniform mass distribution is done in such a way that it enlarges the harvested voltage efficiency considerably since the harvesters described herein can have a higher power density in comparison to the conventional piezoelectric harvesters.

For example, the harvester efficiency can be improved by increasing the amount of stress/strain by: (1) utilizing serpentine cantilevers to increase the surface area of the energy harvester to increase the amount of bending while not substantially increasing the overall footprint of the energy harvester; and (2) assigning proof masses at different locations for uniform mass distribution with an eccentric symmetry. The inventors have found that these two features allow for all of the segments (i.e., zones) of the energy harvester to be activated and involved in energy harvesting during device operation, which also provides the energy harvester with a higher power density compared to the conventional harvesters. This has been shown by numerical and experimental results, which are described herein.

Since the proposed harvester has an eccentric geometry with nonlinear behavior, the conventional optimization methodologies for enhancing performance of MEMS piezoelectric harvesters, such as variant-mesh analysis [8], and correlation matrix [9] are not useful, due to the requirement of acute human observation. However, in accordance with the teachings herein, to obtain the optimal performance of the harvesters described herein, the inventors propose an automated design and optimization methodology that uses a Genetic Algorithm (GA), which requires minimal human effort.

It should also be noted that the harvester structures described herein are also compatible with regular MEMS fabrication process methods. To prove the manufacturability of the harvesters described herein with the regular MEMS fabrication process, an optimized piezoelectric MEMS energy harvester, which had its frequency response enhanced by using GA-based optimization as described herein, was fabricated and tested.

In one example embodiment, an optimized harvester occupies an area of about 3.2 mm$^2$. This harvester is a piezoelectric MEMS that can generate voltage at multiple resonant modes, such as 227 Hz, 259 Hz, and 285 Hz for the first, second and third mode, respectively. In this example embodiment, when the device operates at its second mode frequency, nonlinear behavior can be obtained with extremely small magnitude of base excitation (i.e. 0.2 m/s$^2$). In this example embodiment, a normalized power density (NPD) of 2689.2 μW·cm$^{-3}$ m$^{-2}$s$^4$ can be obtained under certain circumstances.

Referring now to FIG. 1A, shown therein is an example embodiment of an energy harvester 10 in accordance with the teachings herein. The energy harvester 10 is a piezoelectric MEMS vibration energy harvester that is capable of MDOF. The energy harvester 10 has a geometry that is anchored on two opposite sides, which can viewed as a doubly clamped cantilever. As shown in FIG. 1A, the geometry of the energy harvester 10 comprises three different proof masses including a main central mass 13 and two lateral masses 11 and 15 that are at three different locations such that the mass assignment provides uniform mass distribution in the entire MEMS harvester geometry. The proof masses 11, 13 and 15 are suspended by serpentine beams (i.e. to provide cantilevers), which have a deposition of piezoelectric material on their surface. With this geometry, the serpentine beams are considered as an active area of the energy harvester 10.

The geometry of the energy harvester 10 and location of the proof masses 11, 13 and 15 can make the energy harvester 10 harness the generated voltage effectively and efficiently at multimode frequencies. For example, the stiffening phenomenon will occur at the location of the proof masses 11, 13 and 15 due to their considerable thickness. Since the amount of the stress/strain in such locations can be zero, they can be considered as passive regions. On the other hand, the large bending, which helps increase the energy conversion efficiency of the harvester 10, can be offset by the big size of the proof masses 11, 13 and 15. Thus, the locations of the proof masses 11, 13 and 15 can have an effect on the implementation and performance of MEMS harvesters. Furthermore, in accordance with the teachings herein, the serpentine structure has several beams that are used to increase the movement/bending of the energy harvester 10. The proof masses 11, 13 and 15 do not eliminate stress but, in contrast, the location and weight of the proof masses 11, 13 and 15, in addition to the geometry of the serpentine cantilevers, help improve the bending of the beams and therefore increase the voltage that is generated by the energy harvester 10.

The mass 15 has a rectangular cross-section with a width $W_m$ and a length $L_m$. The mass 13 has a circular cross section with a diameter $L_r$. The mass 11 has a rectangular cross section with a width $W_m$ and a length Lm. The location and weight of the masses 11, 13 and 15 are selected to provide a uniform mass distribution on the serpentine structure of the energy harvester 10. The weight of each proof mass 11, 13, and 15 determines the amount of bending for the beams and the resonant frequencies of the energy harvester 10. Therefore, the operational frequency of the energy harvester can be tuned by changing the size of the proof masses. However, the functionality of the energy harvester 10 is not dependent on the shape of the proof masses 11, 13 and 15, which can be circular, rectangular, elliptical or square. However, the functionality of the energy harvester 10 does depend on the size (and therefore weight) of the proof masses 11, 13 and 15.

The serpentine structure extends about a longitudinal axis LAX of the energy harvester 10. The serpentine structure is formed of a plurality of beams 23, 25, 43, 45, 55, 53, 35 and 33. The serpentine structure has a mid-portion including beams 45 and 55 that are disposed along the longitudinal axis LAX, a first serpentine portion S1 that includes beams 53, 35 and 33 and extends from a first end of the mid-portion of the serpentine structure; and a second serpentine portion S2 that includes beams 43, 25 and 23 and extends from a second end of the mid-portion of the serpentine structure.

The beams of the first and second serpentine portions S1 and S2 have varying lengths and orientations such that sequential beams have a different length and orientation or are laterally spaced apart from one another. Furthermore, the first and second serpentine portions S1 and S2 along with the first and second lateral masses 11 and 15, respectively, have an eccentric geometry since they have a 180 degree rotational symmetry about the main center mass 13.

In this example embodiment, in the first serpentine portion, beam 23 extends longitudinally to lateral mass 15 and has a length La and width $W_b$. The beam 33 extends away from the lateral mass 11 and is coupled to an upper surface of the lateral mass 11. The next beam is beam 35, which is also coupled to the upper surface of the lateral mass 11 but is laterally spaced apart from the beam 33 and extends longitudinally in the opposite direction compared to beam 33. The beam 35 has a length Lb1 and width $W_b$. The next beam is beam 53 which has a first end that is coupled to beam 35 at a 90 degree angle to form a first turn 51. The beam 53 has a second end that is coupled to beam 55 at a 90 degree angle to form a second turn 57. The beam 53 has a length $L_{b2}$ and width $W_b$. The beam 55 has a length $L_{b3}$ and is coupled to a second side of the center mass 13 that is opposite to the first side of the center mass 13 where the beam 45 is coupled.

Also, in this example embodiment, in the second serpentine portion, beam 23 extends longitudinally to lateral mass 15 and has a length $L_a$ and width $W_b$. The beam 23 extends away from the lateral mass 15 and is coupled to an upper surface of the lateral mass 15. The next beam is beam 25 which is also coupled to the upper surface of the lateral mass 15 but is laterally spaced apart from the beam 23 and extends longitudinally in the opposite direction compared to beam 23. The beam 25 has a length $L_{b1}$ and width $W_b$. The next beam is beam 43 which has a first end that is coupled to beam 25 at is a 90 degree angle to form a first turn 41. The beam 43 has a second end that is coupled to beam 45 at a 90 degree angle to form a second turn 47. The beam 43 has a length $L_{b2}$ and width $W_b$. The beam 45 has a length $L_{b3}$ and is coupled to one side of the center mass 13.

The serpentine structure of the energy harvester 10 has tips 21 and 31 that are anchored on two opposite sides of the energy harvester 10. For instance, one end of beam 23 is coupled to the lateral mass 15 to support the lateral mass 15, the second serpentine portion, a first portion of the longitudinal region of the serpentine structure and a first portion of the central mass 13 and the other end of beam 23 is tip 21 which is anchored. Likewise, one end of beam 33 is coupled to the lateral mass 11 to support the lateral mass 11, the first serpentine portion, a second portion of the longitudinal region of the serpentine structure and a second portion of the central mass 13, and the other end of beam 33 is tip 31 which is anchored.

It should be noted that an optimum value of $L_a$ can provide lower and closer multimodal resonant frequencies for the energy harvester. If the beams 23 and 33 are removed ($L_a$ is zero) and the lateral proof masses 11 and 15 are anchored and they would provide no contribution to the vibration of the entire harvester. Since considerable bending results in an improvement in energy conversion efficiency and to obtain stress from ambient vibrations, the proof masses of the energy harvesters described herein are suspended by anchoring the ends 21 and 31 of beams 23 and 33, respectively.

In an alternative embodiment, the cantilevers can have an L-shape rather than a serpentine shape. For example, a first L-shaped cantilever can extend away from a first side of the mid-portion of the energy harvester so that the corner of the "L" is at the upper right hand corner of the energy harvester, one end of the first L-shaped cantilever is coupled to the mid-portion of the energy harvester and the other end of the first L-shaped cantilever is anchored at the bottom right of the energy harvester. Likewise, a second L-shaped cantilever can extend away from the second side of the mid-portion of the energy harvester such that the corner of the "L" is at the lower left hand corner of the energy harvester, one end of the second L-shaped cantilever is coupled to the mid-portion of the energy harvester and the other end of the second L-shaped cantilever is anchored at the top left corner of the energy harvester. Therefore, both L-shaped cantilevers have a 180 degree rotational symmetry about the center of the energy harvester where the central mass is located.

Referring back to energy harvester embodiment shown in FIG. 1A, the center mass 13 is disposed at a central region of the mid-portion of the serpentine structure. The first lateral mass 11 is disposed in the first serpentine structure and is offset from the center mass 13 in the longitudinal direction such that the lateral mass 11 is diagonally disposed from the center mass 13. The second lateral mass 15 is disposed in the second serpentine structure and is offset from the center mass 13 in the opposite longitudinal direction such that the lateral mass 15 is diagonally disposed from the center mass 13. Accordingly, the first lateral mass 11 and the second lateral mass 15 are positioned at a distance from tips of the serpentine structure, such that the three masses 11, 13 and 15 create a uniform mass distribution on the serpentine structure. For example, the first and second lateral masses are located at opposite corners of the serpentine structure.

It should be noted that in alternative embodiments, the two lateral proof masses 11 and 15 can be located in any available empty spot. However, in the example embodiment, the lateral proof masses 11 and 15 have been located at the farthest points with reference to their corresponding anchors (e.g. $L_a$) since this arrangement considerably increases the level of bending and the stress/strain that is observed due to the longer distance for each cantilever. In addition, by locating the lateral proof masses 11 and 15 as far as possible from the corresponding anchor point, the stiffening effect of the proof masses 11 and 15 is reduced so as to lead to stronger bending with higher magnitude and an overall larger active cantilever area. To further increase the amount of bending, the weight of the lateral proof masses 11 and 15, and optionally the center proof mass 13, can be increased. In addition, since the lateral proof masses 11 and 15 are considered passive regions since they do not experience any bending, the proof masses 11 and 15 are placed at the region of the energy harvester where the stress/strain is naturally almost zero. In this fashion, the lateral proof masses do not reduce any stress/strain that otherwise occurs during operation.

A layer of piezoelectric material is deposited on a surface of the serpentine structure. Accordingly, during use, when a section of the serpentine structure experiences a strain or a stress, the piezoelectric layer at the section generates a voltage and a corresponding current. The generated current can be obtained by attaching electrodes to the energy harvester where a first electrode forms a bottom layer of the energy harvester and a second electrode is disposed on top of the piezo-electric layer.

It should be noted that many different types of piezoelectric materials, such as PZT, AlN, etc., can be used with sensors or actuators. In order to compare these materials to each other in terms of efficiency, the piezoelectric coefficient, which is determined by the material structures (e.g. arrangement of the molecules), can be used. For an energy harvester, the harvested voltage can be significantly increased if a piezoelectric material with a larger piezoelectric coefficient is utilized. While AlN is used in the prototyped energy harvester described herein, depending on the particular embodiment, the amount of harvested voltage can be increased if other more efficient piezoelectric materials are used such as, for example, PZT.

Since an oscillator with a larger weight will have a lower resonant frequency, it is preferred for the piezoelectric layer to cover the entire surface of the energy harvester 10. In this way, by utilizing this layer along with the electrode layer, a larger area can make the energy harvester heavier so as to reduce its resonant frequencies. Alternatively, in other embodiments, it may be possible for the piezoelectric and the electrode layers to be modified so that at least one of these layers does not cover the entire surface area of the energy harvester 10.

Various configurations can be used for the top electrodes in different embodiments. In addition, a different number of electrodes can be used for the top electrodes in different embodiments. For example, the harvesting efficiency of the energy harvester can be increased by optimizing the top electrode configuration and increasing the number of electrodes that are used. Different methods of dividing the top electrodes into multiple segments can be used. However, during the fabrication process the bottom electrode is not modified since it is part of the body of the energy harvester 10.

Figure 1B:
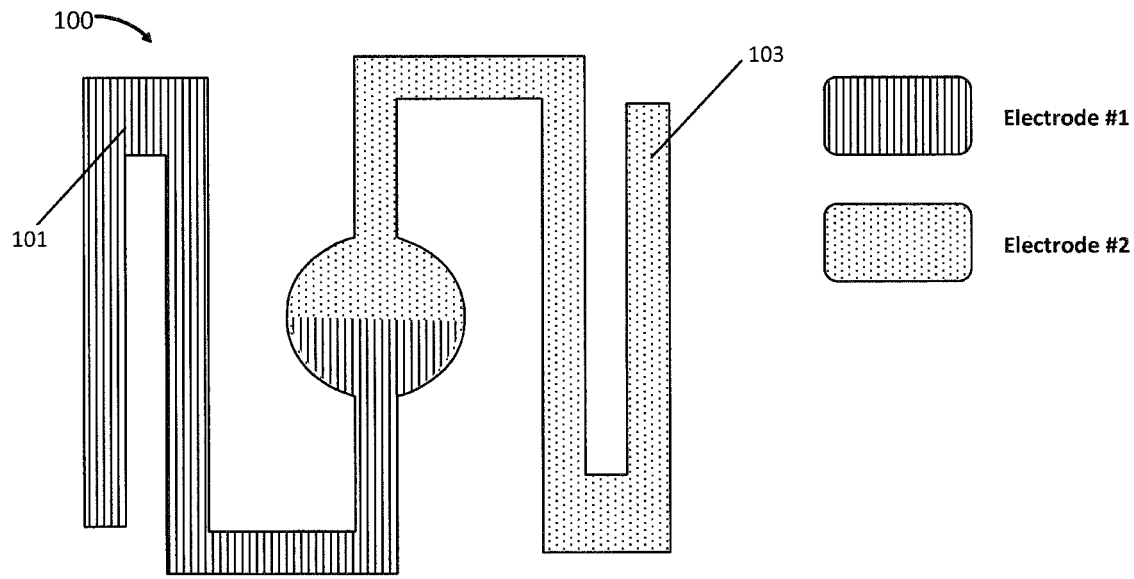
FIGS. 1B-1D illustrate example embodiments of electrodes that can be used with the energy harvester of FIG. 1A.
Figure 1C:
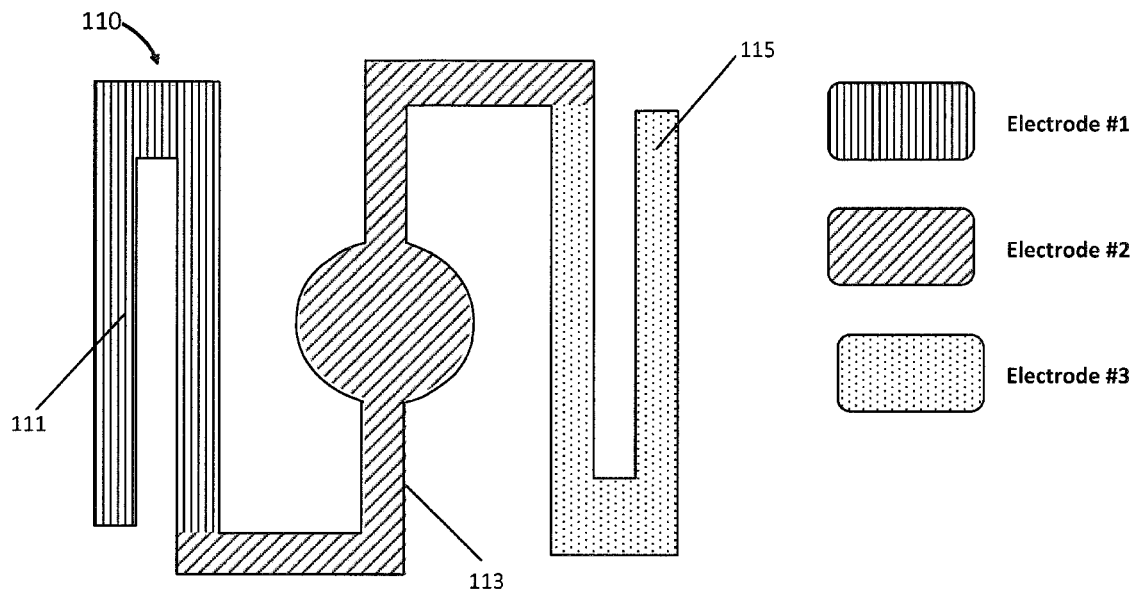

For example, referring to FIG. 1B, shown therein is an example embodiment of a top electrode layout 100 that includes two electrodes 101 and 103. In this example embodiment, the two electrodes 101 and 103 entirely cover the right and left halves of the energy harvester. This may be advantageous in reducing the resonant frequency of the energy harvester that uses the electrode arrangement 100, since covering the entire surface of the energy harvester with a piezoelectric layer and then an electrode layer will make the energy harvester heavier.

Figure 1D:
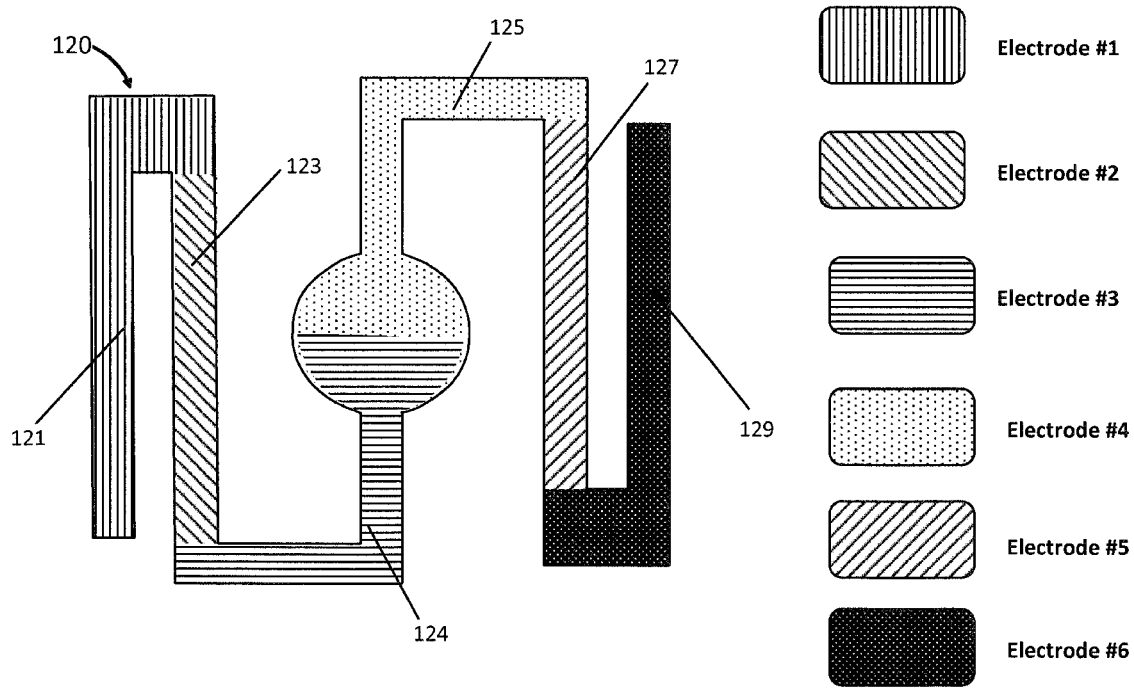

Referring to FIG. 10, shown therein is another example embodiment of a top electrode layout 110 that includes electrodes 111, 113 and 115. Referring to FIG. 1D, shown therein is another example embodiment of a top electrode layout 120 that includes electrodes 121, 123, 124, 125, 127 and 129. These alternative electrode arrangements can: (1) increase the harvested voltage by enlarging the internal impedance of the harvester and (2) minimize the voltage cancelation along each particular piezoelectric cantilever. Further splitting of the electrodes can enhance the amplitude of the harvested power and eliminate the voltage cancelation, as will now be described.

Piezoelectric generators can be modeled as a current source with a parallel equivalent impedance. Therefore, the generated power with this model can be determined according to:

$$P=\tfrac{1}{2}(Z*I^2) \quad (1)$$

where Z is the internal impedance of the piezoelectric generator and I is the generated current by the piezoelectric materials.

The impedance of the piezoelectric generator is in proportion to the piezoelectric capacitance. The piezoelectric capacitance amount is dependent on size of the coverage area by the electrodes. Consequently, by dividing the coverage area to multiple regions, the piezoelectric capacitance can be reduced. As a result, the piezoelectric impedance is increased. By enhancing amount of the internal impedance of the piezoelectric generator, the amplitude of harvested power, according to equation (1), can be made larger.

Figure 2A:
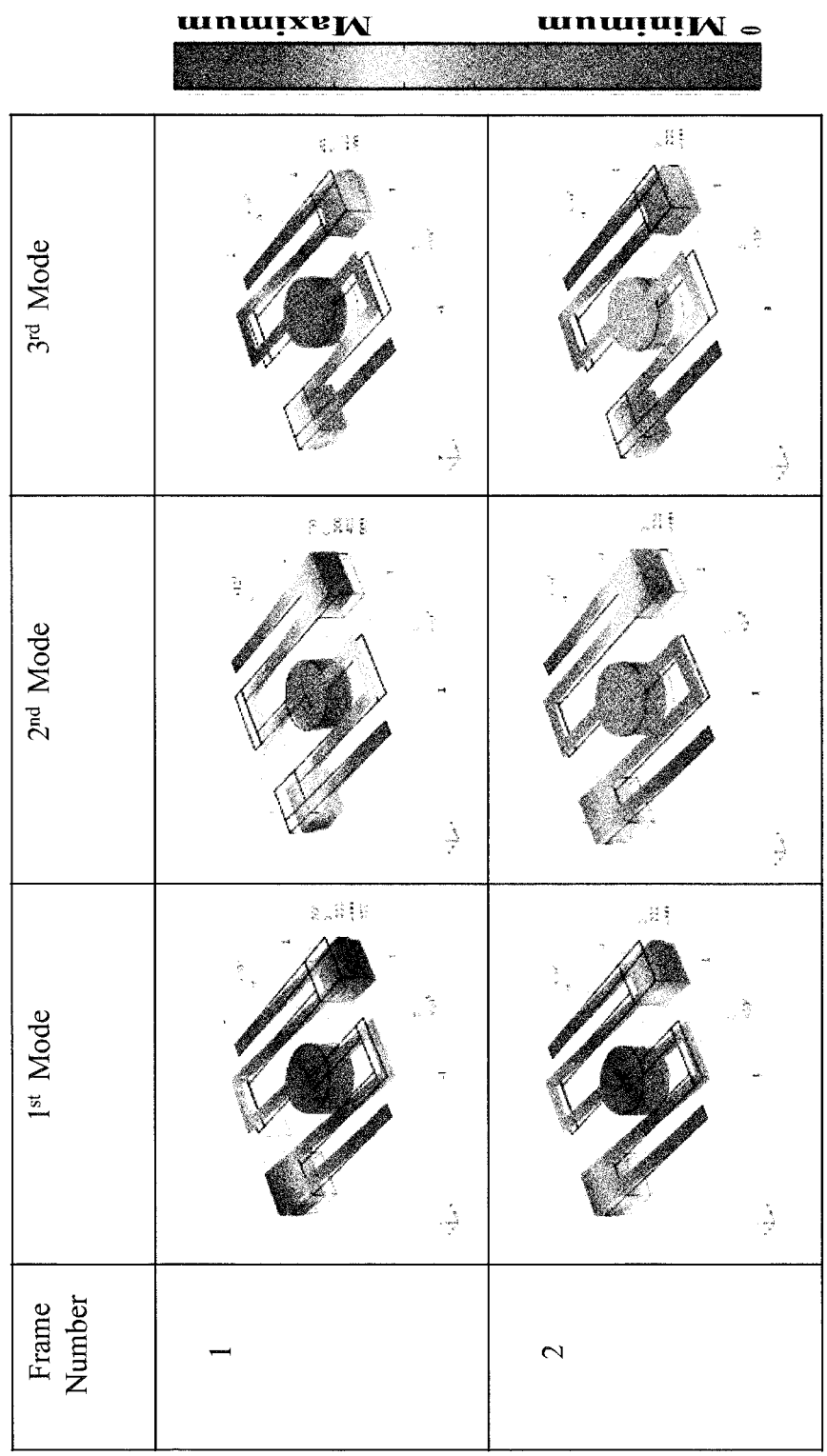
FIGS. 2A and 2B illustrates FEM simulation of the first three mode shapes of the example embodiment of the energy harvester of FIG. 1A in accordance with the teachings herein.
Figure 2B:
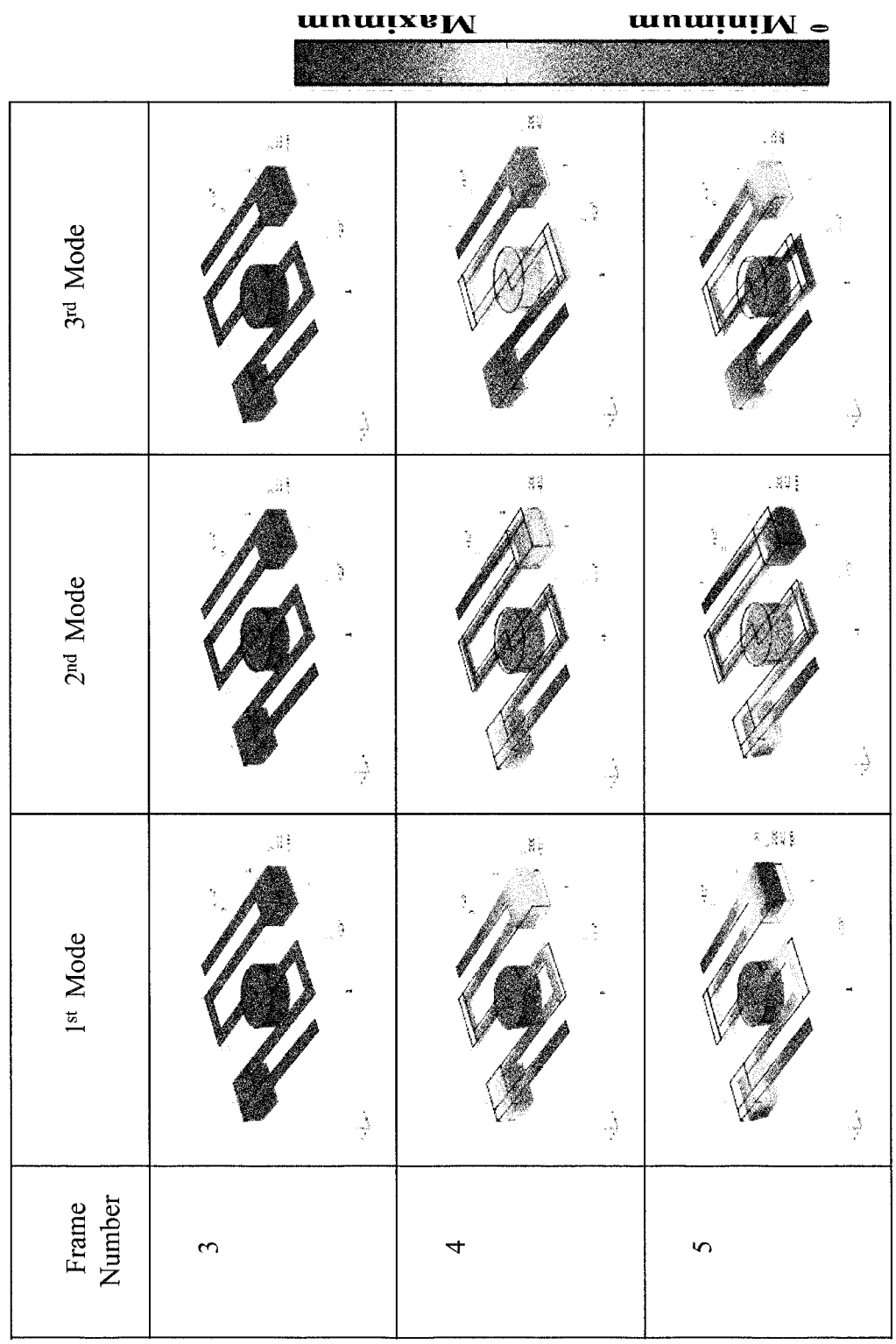

In addition, due to the eccentric geometry of the energy harvesters described herein, during device oscillation, as shown by FIGS. 2A and 2B, the energy harvester vibrates in different directions, which means some parts of energy harvester move upwards, while at the same time the other parts of the energy harvester move downwards. This 180 degree phase difference in deformation of the energy harvester provides negative and positive voltage, simultaneously. Therefore, there may be some amount of voltage cancellation, if only a single electrode is used for the entire top layer of the energy harvester.

Figure 7C:
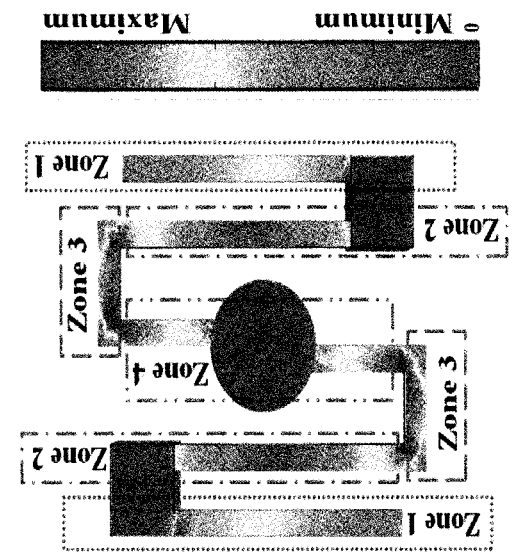
FIGS. 7A-7C show the stress profile at each individual mode of the energy harvester of FIG. 1A for harnessing mechanical stress to produce electrical energy in accordance with the teachings herein.
Figure 7B:
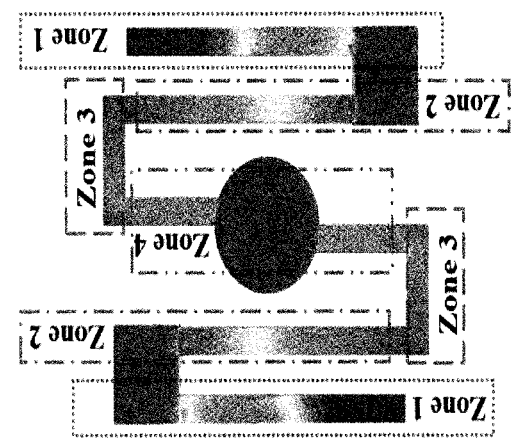
Figure 7A:
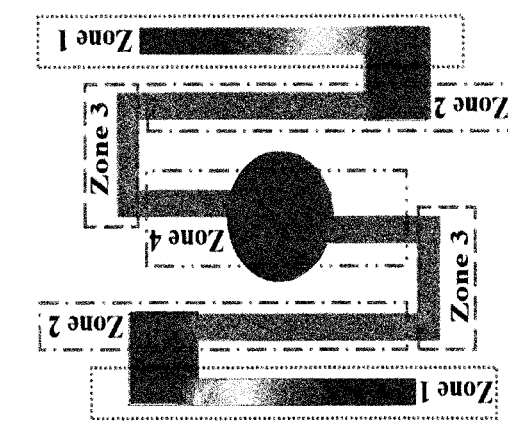
Figure 8A:
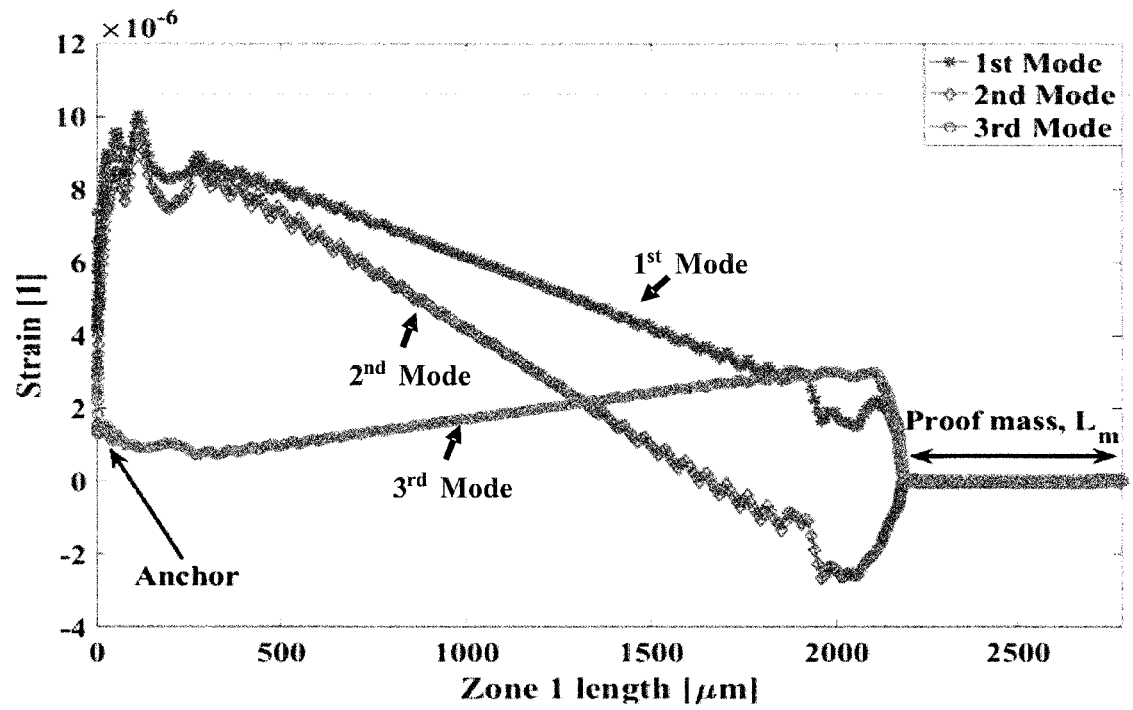
FIGS. 8A-8D shows the efficiency of an example embodiment of an energy harvester at certain specific modes.
Figure 8B:
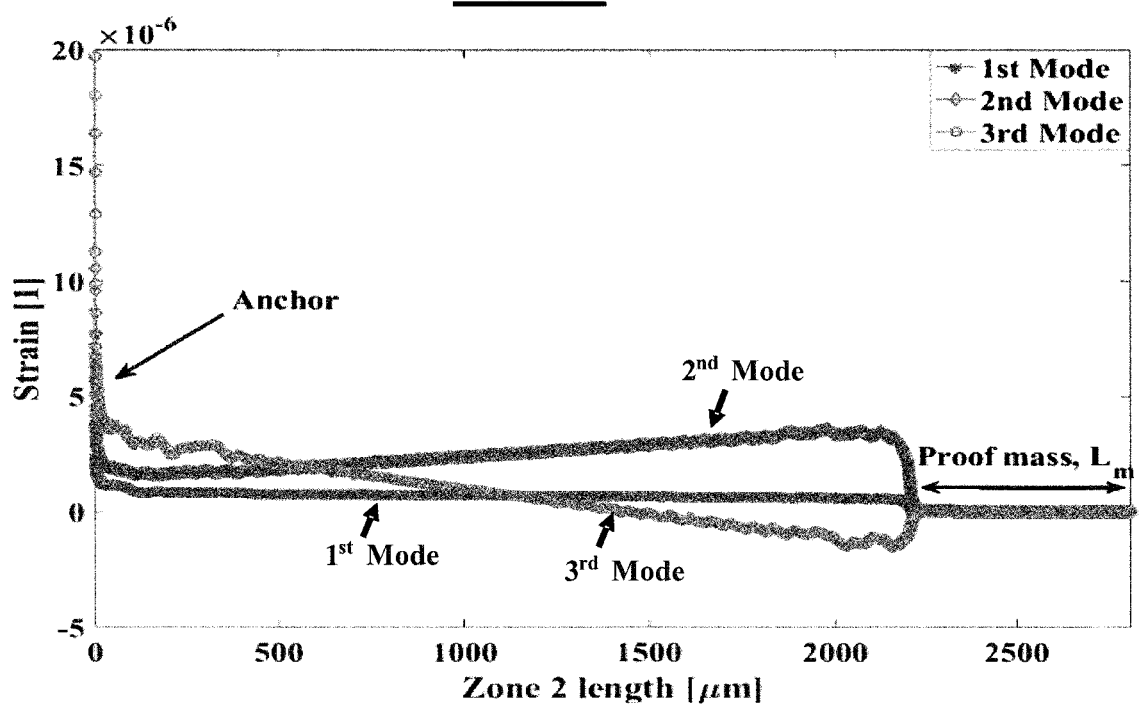
Figure 8C:
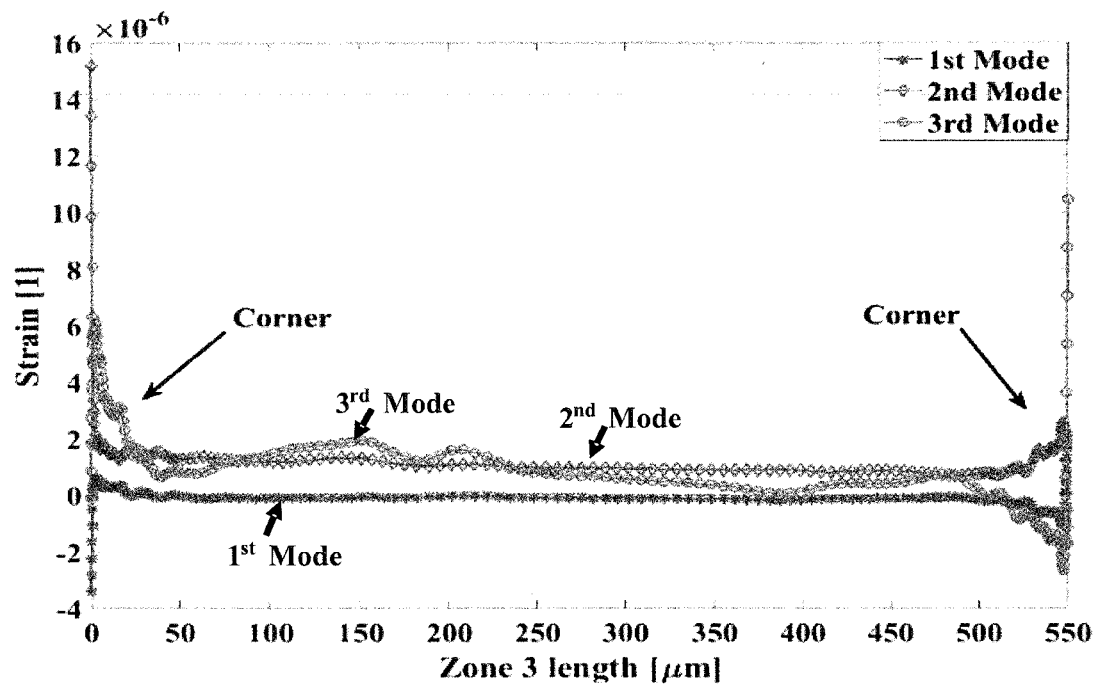
Figure 8D:
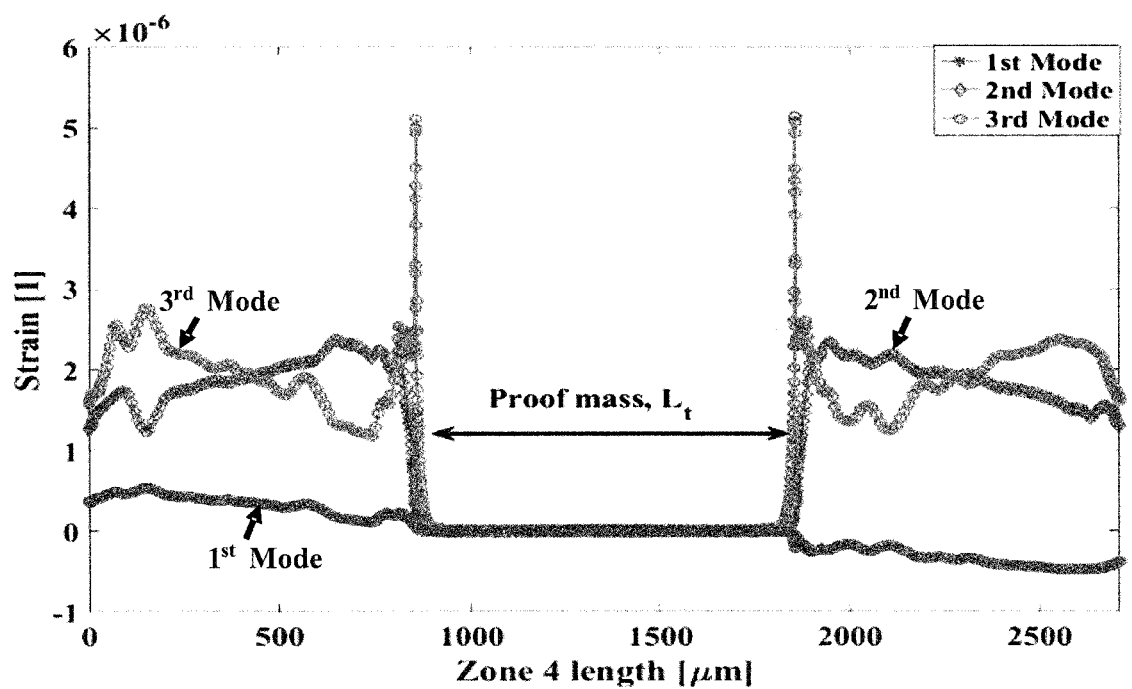

In accordance with the teachings herein, strain/stress can be uniformly observed on the energy harvester 10 if uniform mass distribution is provided. In such a context, more area of the energy harvester can be involved in the energy harvesting in order to enhance the amplitude of the power density of the energy harvester 10. For example, as shown in FIGS. 7A-7C, stress can be gained from all regions of the energy harvester 10 (i.e., zones 1, 2, 3 and 4) due to uniform mass distribution. However, if a non-uniform mass distribution is used similar to the structure of the conventional piezoelectric harvesters, the stress/strain may be only gained from the anchor portions, which are considerably smaller in terms of area. Therefore, in accordance with the teachings herein, for high efficiency, uniform mass distribution with an eccentric geometry can be used.

To graphically demonstrate the performance of an embodiment of the energy harvester at different individual resonant frequency modes, the COMSOL Multiphysics (Version 5.2a) software package was used. In this way, the piezoelectric MEMS energy harvester was modeled using isotropic materials for both the beams and the piezoelectric film, by Eigenfrequency Study, and simulation results for the first three mode were recorded. To clearly show the oscillation of the simulated energy harvester, each mode was recorded for one cycle in 5 different frames showing the vibration at a certain time, with frames 1 and 5 showing the maximum possible displacements in one period and frame 3 showing the neutral position. The multiple modes that were simulated by using Finite Element Modeling (FEM) are shown in FIGS. 2A and 2B.

According to FIGS. 2A and 2B, it can be seen that during the first mode, the proof mass 13 at the center (i.e. $Mass_t$) has no motion, however, the two proof masses 11 and 15 (i.e. $Mass_{c1}$ and $Mass_{c2}$) located at the corners maximally oscillate in an opposite phase. At the second mode, the center mass 13 is not fixed anymore, and similar to the previous mode, the lateral masses 11 and 15 have maximum upward and downward oscillations, while all these three masses vibrate in the same phase. The maximum oscillation in the $3^{rd}$ mode occurs for the center mass 13. The lateral masses 11 and 15 at the corners have oscillations in the same phase with respect to one another but their oscillation phase is opposite with the oscillation phase of the center mass 13.

Figure 3:
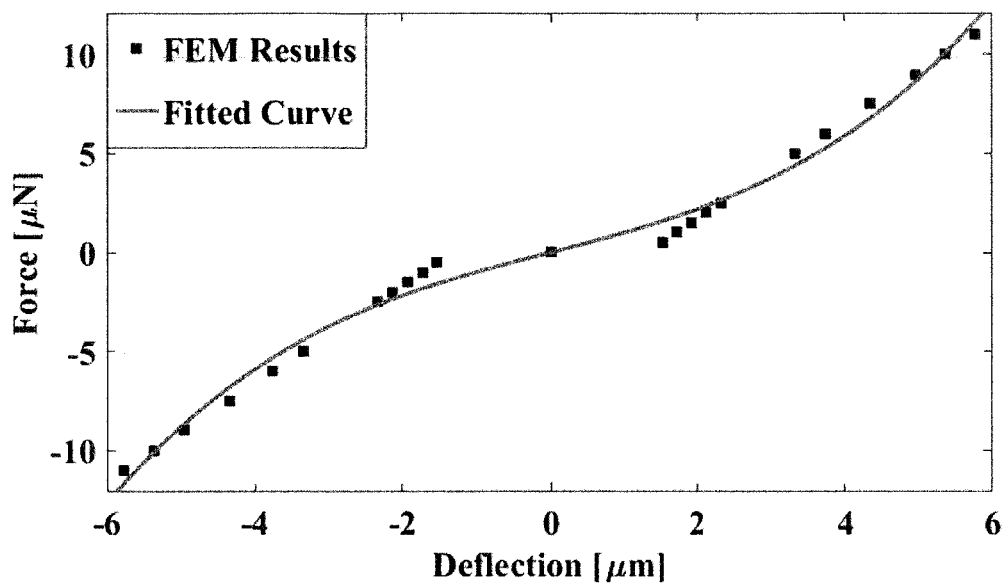
FIG. 3 illustrates FEM simulation results and a fitted curve for estimation of linear and nonlinear mechanical stiffness at the second mode of the energy harvester of FIG. 1A.

To demonstrate the nonlinear behavior of the energy harvester, the mechanical stiffness of the proposed structure is analyzed. From the literature, it is shown that the load-deflection equation for a nonlinear mechanical resonator can be expressed by [10, 11]:

$$F(x)_{load} = k_L x + k_N x^3 \qquad (2)$$

where $k_L$ is the linear stiffness and $k_N$ denotes the cubic (or nonlinear) stiffness. In order to find these two mechanical stiffness parameters, at the second mode, by using FEM simulation different static forces were applied on a known node at the device geometry and its relative deflection was measured. The results are depicted in FIG. 3. A curve fitting method, which was performed using MATLAB, was used to determine the amount of linear and cubic stiffness be $k_L = 1.17$ N/m and $k_N = 4.04e10$ N/m$^3$, respectively, for the second mode of the energy harvester 10. Consequently, it is expected that the energy harvester has nonlinear behavior when operating in the second mode.

The Genetic Algorithm (GA), which is known as an evolutionary optimization methodology, is a procedure that can be used to optimize constrained and unconstrained complex problems by searching in a group of variables, and its capability in trapping the global optima has made it as an outstanding optimization method [12]. The basic working principle of a standard GA is described by Algorithm 1 [13] which is shown in Table 1.

TABLE 1

| Algorithm 1. The working principle of the GA |
| --- |
| 1: Start: Generate a random population with a size of n chromosomes |
| 2: Fitness: Evaluate the fitness of each chromosome in the entire population |
| 3: Selection: Select two chromosomes from the population based on their fitness |
| 4: Crossover: Exchange part of the chromosomes according to crossover probability for generating offspring |
| 5: Mutation: Mutate the offspring according to a mutation probability |
| 6: Accepting: Interpolate new offspring in the new population |
| 7: Replace: Utilize new generated population for a further run of the algorithm |
| 8: Test: If termination conditions are satisfied, stop, and report the best solution(s) from the current population |
| 9: Repeat: Go to step 2 for further evaluation |

Figure 4:
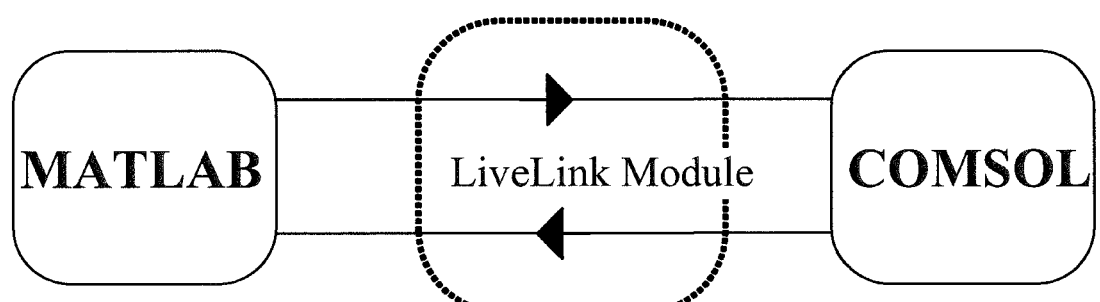
FIG. 4 shows an example flow diagram for an optimization methodology that can be used to determine certain parameters of an energy harvester in accordance with the teachings herein.

In accordance with the teachings herein, the GA has been utilized to optimize the frequency operation of the piezoelectric MEMS harvester described herein. In this regard, the proof masses located at the corners, i.e. Mass$_{-c1}$ and Mass$_{-c2}$, and the anchor locations were considered as optimizable parameters. The GA fitness functions, for multi-objective optimization, were defined as:

Minimize: mean($f_1, f_2, f_3$),

Minimize: {sum of the intervals between($f_2, f_1$) & ($f_3, f_2$)},

Subject to: design rules of the optimizable parameters, (3)

where $f_1$, $f_2$ and $f_3$ are the first, second and third resonant frequency modes, respectively, whose amounts can be obtained from numerical simulation. Therefore, an optimization engine can be made by implementing the GA in MATLAB and linking it to COMSOL Multiphysics FEM software by the LiveLink module, as shown in FIG. 4. The functionality of the GA-based optimization method proposed in accordance with the teachings herein for reducing the resonant frequency using a geometry having nonlinear behavior is now illustrated.

For example, the GA fitness functions represent two desirable objectives: (1) operating the energy harvester 10 at lower resonant frequencies; and (2) locating the first three resonant-frequency modes in the vicinity of one another which has the effect of widening the operational bandwidth of the energy harvester 10. This is advantageous since the energy harvesters that operate at lower resonant frequencies are more practical than the other harvesters that operate at larger frequencies. As a result of the GA-based optimization described herein, since the three frequency-mode peaks, which are labeled as $f_1$, $f_2$ and $f_3$, can appear close to one another, the modes are thereby coupled together so that their individual effect on the other resonant frequencies is stronger. A highly desirable energy harvester can be implemented, if both objective functions can be successfully achieved.

One of the advantages of the GA-based optimization methodology proposed herein is that designers can determine their distinct objective functions for implementing an energy harvester as per their specific requirements. For example, while the GA-based optimization methodology can be used to minimize the first three resonant-frequency peaks (i.e., $f_1$, $f_2$ and $f_3$) in terms of their amounts and intervals, in an alternative embodiment, the minimization can be conducted on only one mode (e.g., second mode $f_2$). In addition, it is also possible for designers to follow a single-objective optimization (e.g., minimization of the mean resonant frequency) rather than the multi-objective optimization discussed above.

In addition, the design rule constraints depend on the utilized micromachining technology, and can therefore vary from technology to technology. In this regard, the foundries can provide information regarding the design rule constraints that are to be met by the designers in the design process.

For example, a prototyped energy harvester, in accordance with the teachings herein, can be fabricated using a commercial technology process, such as PiezoMUMPs for example, and the design rule constraints that can be used in the optimization method can be provided by the foundry. For example, the foundry may provide design rule constraints such as having a 1 mm*1 mm maximum size for the proof masses, a distance of 200 μm as the minimum gap between etched areas, and a width of 10 μm as the minimum beam width, etc. Therefore, the design rule constraints can be incorporated into the proposed GA-based optimization and can be adjusted based on the selected micro-machining technology rather than being selected by the designers.

In order to measure the performance of a multimode wideband piezoelectric MEMS vibration energy harvester that is structured in accordance with the teachings herein, a prototype was fabricated using a bulk micro-machining process. The fabrication process employed a layer ordering and configuration that is in accordance with the teachings herein. The inventors determined that manufacturing the energy harvester does not need any advanced micro fabrication processes at all. An example embodiment of the fabrication process is now described with reference to FIGS. 5A-5F.

Referring now to FIG. 5A, shown therein is a first step 510 in the fabrication process which involves deposition of a phosphosilicate glass (PSG) layer on a silicon wafer. The SOI wafer may be double-sided and the SOI wafer may be polished in some embodiments. The SOI wafer includes a bottom oxide layer 515, a substrate layer 514 that is positioned on top of the bottom oxide layer 515, an oxide layer 513 that is positioned on top of the substrate layer 514 and a silicon layer 512 that is positioned on top of the oxide layer 513. The SOI wafer includes a top surface on top of the silicon layer 512.

For instance, in the example prototype, the top surface of a 150 mm n-type Silicon On Insulator (SOI) wafer was doped by depositing a PSG layer 511. After deposition, the SOI wafer was annealed at about 1050° C. for about one hour in argon to drive the phosphorous dopant into the top surface of the silicon wafer. The PSG layer was subsequently removed using wet chemical etching.

Referring now to FIG. 5B, a second step 520 in the fabrication process involves deposition of piezoelectric material on the top surface of the silicon layer 512. For instance, in the example prototype, a 0.5 micrometer Aluminum Nitride (AlN) layer 521 is deposited on top of the surface of the silicon wafer 512 by reactive sputtering. After that, the AlN layer is patterned, wet etched, and then subjected to a solvent resist strip.

Referring now to FIG. 5C, shown therein is a third step 530 in the fabrication process, which involves Si etching and deposition of the top electrode configuration. For instance, in the example prototype, a metal composite layer 531 comprising 20 nm of chrome (Cr) and 1 µm of aluminum (Al) was deposited on top of the AlN layer 521. The metal composite layer 531 was then patterned on top of the AlN layer 521 through a liftoff process. Thereafter, the silicon layer was lithographically patterned and etched down to the bottom oxide layer by using Deep Reactive Ion Etch (DRIE).

Referring now to FIG. 5D, shown therein is a fourth step 540 in the fabrication process which involves deposition of protection material on one side of the silicon wafer. For instance, in the example prototype, a protection material 541 was applied on the top surface of the silicon wafer.

Referring now to FIG. 5E, shown therein is a fifth step 550 in the fabrication process which involves etching and removal of the protection material by using a pattern to form the serpentine structure and proof masses of the energy harvester 10. For example, the wafer may be lithographically patterned from the bottom surface. The pattern was then etched using RIE and DRIE. A wet oxide etch process was then used to remove the bottom oxide layer. The protection material on the front surface of the silicon wafer was then stripped using a dry etch process.

A schematic top view of a harvester 560 that is fabricated according to the above described fabrication process is illustrated in FIG. 5F. The harvester 560 includes anchors at 567 and 569, the serpentine structure, and masses 561, 563 and 565.

It should be noted that in the description of the prototype that follows below, example materials, example dimensions and example processing parameters are provided to describe the fabrication process and that these parameters may be varied when fabricating other prototypes which may be designed differently to achieve certain levels of performance. For example, the materials can be easily changed for each mask layer in the micro-machining process. For instance, the piezoelectric mask layer can be made by using AlN (aluminum nitride), PZT (lead zirconate titanate), ZnO (zinc oxide), or PVDF (Polyvinylidene fluoride). Similarly, the material used for the top electrode layer can be Al/Cr (aluminum/chrome) or Pt/Ti (platinum/titanium).

In an example embodiment, the masses 15 and 11 may be identical and have a weight of about 393 nano-grams (ng), while the weight of the central mass 13 is about 732 ng. The available silicon area that can be used with the energy harvester is about 3.2*3.2 mm$^2$.

As described previously, the frequency response of the proposed multimode energy harvester can be improved by using structural optimization. Referring back to FIG. 1A, by utilizing the GA-based optimization methodology described herein, an optimum size for the dimensions of various elements of the energy harvester 10 can be determined in accordance with defined fitness functions. In this regard, the anchored beam length $L_a$ (i.e. the distance from masses $c_1$ and $c_2$ to their corresponding anchors), and the length $L_m$ of the two proof masses at the corners were defined as optimizable parameters. The GA-based optimization method then strives to satisfy the assigned fitness functions by optimizing the values of these two parameters subject to certain constrains. For example, it should be noted that during optimization process, the rest of the features of the energy harvester 10 are assumed to be constant, and these un-optimizable parameters amounts are summarized in Table 2.

TABLE 2

Sizes of un-optimized parameters for estimation of frequency response of the harvester during FEM simulation.

| Parameters | Description | Size [µm] |
|---|---|---|
| $L_t$ | Proof mass diameter at centre | 1000 |
| $L_{b1}$ | First beam length | 3000 |
| $L_{b2}$ | Second beam length | 950 |
| $L_{b3}$ | Third beam length | 1055 |
| $W_b$ | Beam width | 200 |
| $W_m$ | Proof mass width at corners | 700 |

The effectiveness of the GA-based optimization method is dependent on the size of search area, which can be determined by two user defined parameters, i.e., population size and generation number. Therefore, to show effect of these user defined values on optimization results, the GA-based optimization method was executed with two different population sizes, 10 and 20, however, the same generation number, 20. To demonstrate the capability of enhancing the frequency operation of the energy harvester by using the GA-based optimization methodology, which is modified in accordance with the teachings herein, an un-optimized structure was defined, whose size of optimizable variables were chosen to be median values. The obtained results for un-optimized and optimized energy harvester devices are summarized in Table 3. In this table, the allowable ranges for the optimizable parameters, which are defined based on design rule constraints, are listed in the second and third columns. The fitness functions values for mode mean and sum of the mode interval calculations are presented in the 7$^{th}$ and 8$^{th}$ columns, respectively. In addition, the required time to conduct the GA-based optimization is shown in the 10$^{th}$ column.

TABLE 3

Simulated resonant frequency modes and calculated objective functions values for un-optimized and optimized proposed wideband piezoelectric MEMS energy harvesters.

| Parameter | Mass length $L_m$ [μm] | Anchor point $L_a$ [μm] | 1$^{st}$ mode $f_1$ [Hz] | 2$^{nd}$ mode $f_2$ [Hz] | 3$^{rd}$ mode $f_3$ [Hz] | Mode mean [Hz] | Mode sum interval [Hz] | Popul'n Size | Run time [min] |
|---|---|---|---|---|---|---|---|---|---|
| Range | [500-2000] | [500-3300] | | | | | | | |
| Un-OPT | 750 | 1400 | 331.54 | 547.17 | 744.35 | 541.02 | 421.81 | — | — |
| OPT1 | 546 | 2380 | 284.46 | 288.41 | 348.92 | 307.26 | 64.46 | 10 | 141 |
| OPT2 | 603 | 2780 | 227.48 | 258.58 | 291.01 | 259.02 | 63.53 | 20 | 280 |

According to the information listed in Table 3, it can be understood that the un-optimized harvester, labeled as Un-OPT, can be operated at high frequencies, since the modes are observed at higher frequencies that are extremely separated from one another. The obtained optimization results by executing the GA with a population size of 10, labeled as OPT1, show that the optimization methodology can reduce operation frequency and mode intervals by a factor of 43% and 84%, respectively, in reference to the un-optimized harvester. The reduction in operation frequency and mode interval for the optimized harvester with population size of 20, named as OPT2, are 52% and 85% for the mode mean and sum of mode intervals, respectively.

It can be seen that increasing the number for the population size of the GA improves the effectiveness of the optimization methodology in trapping optimum solutions, because larger population size provides a larger search area for the GA to find optimal values for the parameters. However, by increasing population size, the required run time also increased. From the summarized data in Table 3, it is clear that the energy harvester OPT2 can be vibrated at lower frequencies, while its resonant frequency modes are sufficiently close to each other.

Power harvesting at lower resonant frequency modes for the vibratory harvesters is desirable. For example, the experimentally surveyed properties of harvestable ambient vibration resources that are freely available in the environment (such as wind flow, ocean wave, human motions, etc.) show that these vibration resources oscillate at low frequencies. Energy from ambient vibrations can be harvested more efficiently, if the operational frequency of the piezoelectric energy harvesters described herein can be identical or as close as possible to the ambient vibration frequencies. In this regard, energy harvesters with the capability of actuating at lower resonant frequencies can be highly advantageous. However, the main challenge in scaling down the size of the energy harvesters to the micro-level (i.e., MEMS scale) is that the reduction in the physical size of a mechanical resonator actually increases its resonant frequency, which is impractical for use in a real environment. For this reason, energy harvesters with lower resonant frequencies are desirable and this has been achieved according to the teachings herein by using the GA-based optimization methodology described herein. In addition, if the frequency intervals of the different operational modes can be significantly reduced, those modes will be more effectively coupled together, which can also be effective for enlarging the device operational frequency bandwidth of the energy harvester. The low operational frequency and the closeness of the frequency of the first three modes can be achieved with the MEMS energy harvesters described in accordance with the teachings herein.

Figure 6:
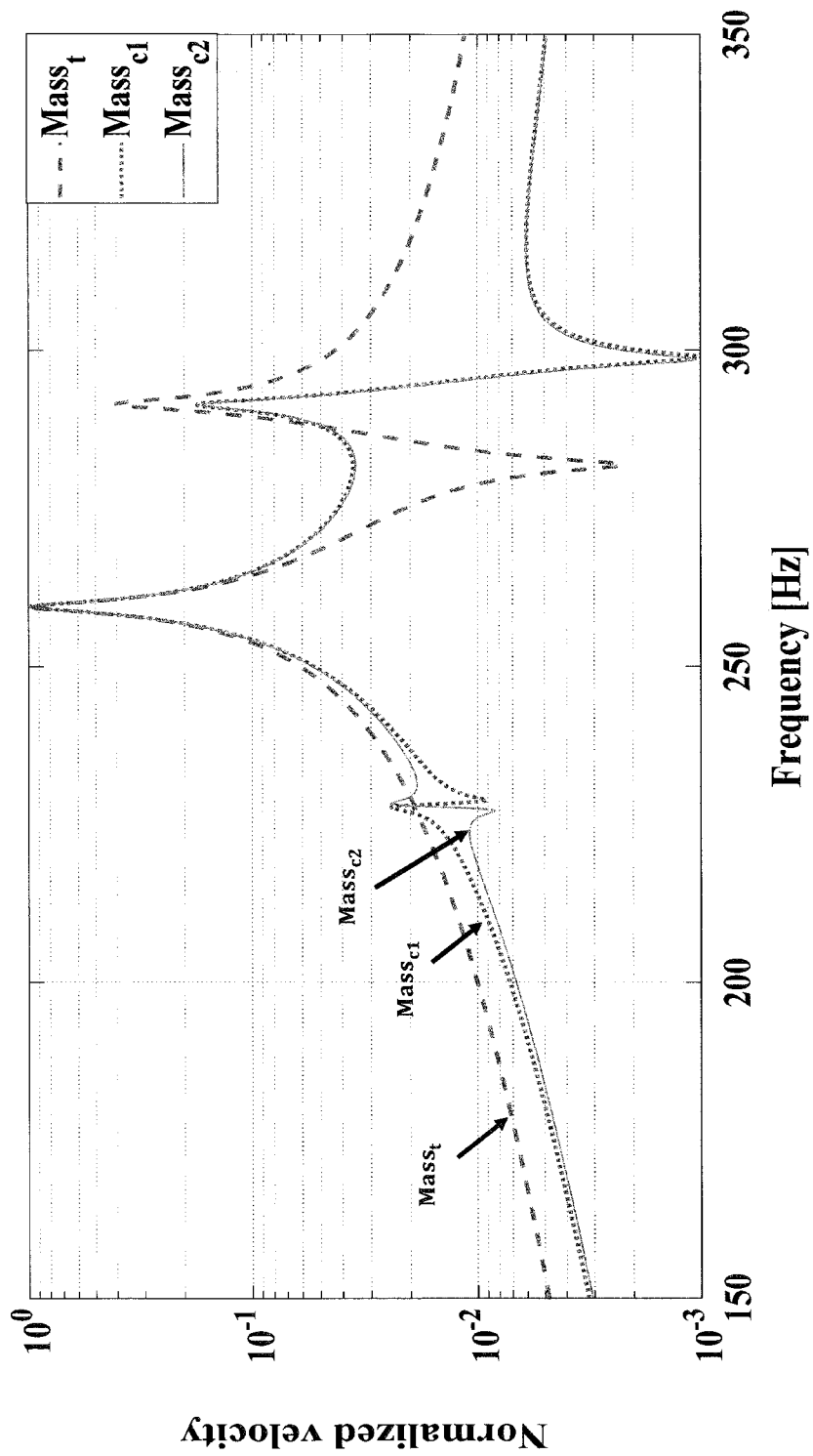
FIG. 6 shows the frequency spectrum of an example embodiment of an optimized energy harvester by utilizing FEM simulation.

Referring now to FIG. 6, shown therein is a frequency spectrum obtained by performing FEM simulation on the optimized energy harvester OPT2. In order to find the device frequency response, the velocity of the three proof masses, (i.e. Mass$_{c1}$, Mass$_{c2}$ and Mass$_t$) are measured individually. From these simulation results, one can observe that the energy harvester OPT2 has a maximum oscillation at its second resonant frequency mode. Furthermore, FIG. 6 clearly shows that at the first resonant frequency mode, the located proof mass at the centre (i.e. Mass_t) has no oscillation, while the two other masses (i.e. Mass$_{c1}$ and Mass$_{c2}$) are able to vibrate. Thus, by considering oscillation of all parts of the energy harvester OPT2, it can be seen that the energy harvester OPT2 can perform at three frequency mode shapes, where the first, second and third modes are observed at 227.48 Hz, 258.58 Hz and 291.01 Hz, respectively.

According to the IEEE standard on piezoelectricity [14], if the electrodes are arranged according to a capacitor model [15], the harvested open circuit voltage is represented by equation (4):

$$V_{op} = g_{31} t_p \sigma_p \qquad (4)$$

where $g_{31}$ is the piezoelectric coefficient, $t_p$ is the piezoelectric film thickness and $\sigma_p$ denotes the actuating stress on piezoelectric material. Consequently, the efficiency of energy harvesters is proportional to the capability of their geometries in absorbing mechanical stress. To demonstrate active areas of the energy harvester OPT2 for harnessing mechanical stress, its stress profile at each individual mode is shown in FIGS. 7A-7C. Specifically, FIGS. 7A-7C show the stress distributions on the piezoelectric film of the multimode energy harvester OPT2 at: (A) first, (B) second and (C) third modes, respectively.

According to FIG. 7A, when the energy harvester OPT2 is operating at its first resonant frequency mode, the maximum actuating stress can be observed in zone 1 while zone 3 only receives very small magnitude of stress. Once the energy harvester OPT2 is excited by its second resonant frequency mode, as shown in FIG. 7B, considerable amounts of stress are observed in zones 1 and 2. It is worth noting that at the second mode, some amount of the applied stress can be experienced in zone 4 besides zone 3. In FIG. 7C, it is demonstrated that if the energy harvester OPT2 oscillates at its third resonant frequency mode, zones 3 and 4 can considerably absorb the applied stress. It can be understood that, at the third mode, zones 1 and 2 are capable to convert the stress to electricity, due to the absorbed stress in these regions. This analysis of stress distribution shows that at various frequencies the stress can be harnessed almost throughout the entire geometry of the energy harvester. In other words, all segments of the energy harvester are involved in energy harvesting, which results in extremely high power density.

Referring now to FIGS. 8A-8D, shown therein are plots of strain distribution along the beams and the efficiency of the piezoelectric MEMS energy harvester OPT2 for each specific mode, which was determined by using FEM simulation. FIGS. 8A-8D show that the magnitude of strain is considerable only in zones 1 and 2, when the harvester is excited at its first mode. Thus, it can conclude that at the first resonant frequency mode the active area for accumulation of strain is about 43% with average magnitude of about $4.3*10^{-6}$. During the energy harvester operation at its second and third modes, all zones are functional. That is to say, 60% of the energy harvester surface area are active areas for voltage harnessing during the second and third modes with an average magnitude of about $6.5*10^{-6}$ and $4.7*10^{-6}$, respectively. Since the majority of the energy harvester surface area (i.e., 60%) is active for collecting and converting mechanical energy to electricity, it can be seen that the structure of the energy harvester with its unique geometry and mass distribution has high efficiency in generating voltage since all of the zones (see FIGS. 7A-7C) are involved in energy conversion.

Furthermore, in FIGS. 8A-8D, it is shown that the proof masses cause stiffening and, therefore, in these regions the magnitude of strain is zero. From the simulation results, it can also be seen that the peak strain can be received in several regions, such as the anchor parts, the corners and the vicinities of the proof masses. Based on a comprehensive comparison between FIGS. 7A-7C and 8A-8D, it can be understood that the highest efficiency in voltage harvesting occurs at the second and third modes, respectively, for this particular embodiment (i.e. energy harvester OPT2). Consequently, the harvested voltage at the first mode has smaller magnitude, in comparison to the harvested voltage at the two other modes, since at the second and third modes the stress/strain is distributed along the entire geometry of the energy harvester with large magnitude.

In an alternative embodiment, it has been found that the lifetime and reliability of the piezoelectric MEMS vibration energy harvesters may be enhanced by modifying their anchor shape. For example, in some embodiments, the anchor shape may be curved. Referring now to FIGS. 9A to 9D, shown therein is a portion of an example embodiment of a MEMS harvester 600 with a curved anchor 602. The curved anchor 602 has a first anchor region 604 and a second anchor region 606, with an arcuate, or curved, beam 608 extending therebetween. The MEMS harvester 600 has a straight beam 610 that extends from a mid-region of the arcuate beam 608. In some embodiments, the MEMS harvester 600 may have at least one proof mass. As shown in FIG. 9A, the MEMS harvester 600 has a first proof mass 601 located at the distal end 614 of the straight beam 610 and an additional proof mass 603 located at an apex 612 of the arcuate beam 608. The proof masses 601 and 603 may have the same mass and are illustrated here for testing purposes. The proof masses 601 and 603 have smaller dimensions compared to the opposing proof masses used in the energy harvester (such as the one depicted in FIG. 1A). The apex 612 is the most distal point, on the arcuate beam 608 or 602, from the anchor regions 604 and 606.

The curved anchor scheme may improve the durability and energy conversion efficiency of the piezoelectric MEMS vibration energy harvesters. In mechanical devices, the lifetime (i.e., fatigue damage time) is proportional to the amplitude of stress. This relationship can be expressed by the Coffin-Manson equation as shown in equation (5):

$$\sigma_a = \sigma_f'(2N_f)^b \quad (5)$$

where $\sigma_a$ is the stress amplitude, $\sigma_f'$ is the fatigue strength coefficient, $2N_f$ is the number of reversal cycles to failure and b denotes the fatigue strength exponent. The fatigue strength coefficient and exponent (i.e., $\sigma_f'$ and b) are dependent on material properties, which means for a particular material their values are almost constant [16]. Consequently, to increase the number of reversal cycles to failure (i.e., $N_f$), the stress amplitude (i.e., $\sigma_a$) must be reduced by expanding the active area of the device.

In order to increase the active area of the MEMS harvester 600 with minimum impact on the device energy conversion efficiency, the anchor may be curved, as illustrated in FIG. 9A. As shown, the anchor area 602 is expanded by the doubly clamped curve beam 608, while the straight beam 610 with the tip mass 601 is integrated to the centre, or apex 612 of the anchor 602. This structure may allow the stress to be distributed uniformly along the entire anchor region 602. Therefore, the small stress concentration region, which causes damage fatigue, is considerably reduced. Moreover, it is highly advantageous for the MEMS harvester to operate at lower frequencies. To lower the operable frequencies, an additional proof mass 603 may be attached to the centre or mid-region 612 of the curve-shaped anchor 602, to further increase the overall weight of the device.

When incorporating a curved anchor into an energy harvester that is created in accordance with the teachings herein, such as energy harvester 10 of FIG. 1A, for example, an end of one of the arcuate curved beams 608 of a first curved anchor is coupled to anchor tip 21 of the energy harvester 10 and an end of one of the arcuate curved beams 608 of a second curved anchor is coupled to anchor tip 31 of the energy harvester 10. Each of these first and second curved anchors also include the proof mass 603 which is at the mid-region of the first and second curved anchors respectively. The weight of the proof masses 11 and 15 do not have to change. The dimensions of the proof mass 603 may be chosen so that the width of the proof mass 603 is the same as the width of beams 608 and 602 and the length of the proof mass 603 is the same as the width of the beam 610. The shape of the curved anchor and the proof mass 603 generally enhance the lifetime of the energy harvester that incorporates it. The curved anchor can be used for at least one of the anchor point tips of the energy harvester 10 but more improved lifetime can be obtained if curved anchors are coupled to both of the anchor tips of the energy harvester.

As discussed previously, stress concentration in even a small region may cause damage fatigue. Referring now to FIG. 9B, shown therein is a comparison of the stress distribution between an energy harvester 700 with a conventional anchor 702 having conventional geometry and an energy harvester 600 with the curved anchor 602 (i.e. having a curve-shaped anchor topology), as simulated by COMSOL Multiphysics software (Version 5.2a). The conventional harvester 700 has an anchor point 702 with a straight beam 704 extending from the anchor point 702. The conventional harvester 700 has a tip mass 701 located at a distal end 706 of the straight beam 702.

As shown, the conventional MEMS cantilever-based energy harvester 700 experiences a considerable amount of stress only at the anchor point 702, whereas the energy harvester 600 with the curve-shaped anchor 602 has a uniformly distributed stress across almost the entire area of the anchor 602. Thus, it is expected that expanding the anchor area by using the curve-shaped anchor portion can increase the durability of the MEMS harvester 600.

To examine the durability of MEMS harvester 600 with the curve-shaped anchor 602, the fatigue test (i.e., Coffin-Manson approach) by COMSOL fatigue module [17] was performed. In this regard, a cyclic force with different amplitudes was applied at the tip part 614 of the harvester 600. Moreover, the same experiment was conducted for the conventional MEMS harvester 700 with the normal anchor shape. Referring now to FIG. 9C, shown therein is a simulated fatigue lifetime distribution under cyclic mechanical loading with an amplitude of 9.5 mN for (a) the conventional and (b) the curve-shaped piezoelectric MEMS energy harvesters, 700, 600 respectively. As shown in FIG. 9C, the curve-shaped harvester 600 may operate for a large number of cycles (greater than $4*10^6$ cycles) while, under the same load, the conventional harvester 700 breaks at its anchor place 702. Thus, the number of cycles to failure is effectively very low for the curve-shaped anchor harvester 600.

To further investigate the mechanical behaviour of the proposed curved anchor for the harvester, a cyclic loading of 10.5 mN was applied. This loading exceeds the maximum device failure force. Referring now to FIG. 9D, shown therein is a simulated fatigue lifetime distribution under cyclic mechanical loading with the amplitude of 10.5 mN for the curved-shaped piezoelectric MEMS energy harvester 600. The fatigue results show three cracks 616, 618, 620 in a region 622 distal to the anchor places 604, 606. As shown, under this excitation, the initial cracks occur on the straight beam 610, away from the contact areas 604, 606, while the curve-shaped anchor 602 itself experiences no cracks or fractures. Unlike the conventional harvester geometry, the anchor is not the most fragile region that is subject to failure.

FEM simulations were used to compute the frequency responses of the demonstrated MEMS harvesters having the anchors illustrated in FIG. 9B, under an acceleration of 1 g. Referring now to FIG. 9E, shown therein are frequency responses 720 of the conventional anchor and 620 of the curve-shaped anchor piezoelectric MEMS energy harvesters 700, 600 respectively, under the acceleration magnitude of 1 g. It can be seen that, in the energy harvester 600 with the curve-shaped anchor 602, the resonant frequency is reduced to 688 Hz. As described previously, this reduction in frequency is highly desirable for the MEMS energy harvesters. Moreover, the capability of the curved-anchor of the MEMS energy harvester 600 for harvesting voltage is considerably improved in comparison to the conventional harvester 700.

A summary of the behaviour of the conventional and curved-shape anchors is shown in Table 4.

TABLE 4

Summarized behaviour of the conventional and curved-shape anchor piezoelectric MEMS harvesters

| Parameters | Failure Force [mN] | Resonant Freq. [Hz] | Harvested Voltage [mV] | Matched Load [kΩ] | Harvested Power [μW] |
|---|---|---|---|---|---|
| Conventional | 7.3 | 743 | 473 | 288 | 0.77 |
| Curved-Anchor | 9.4 | 668 | 776 | 294 | 2.05 |

Figure 9F:
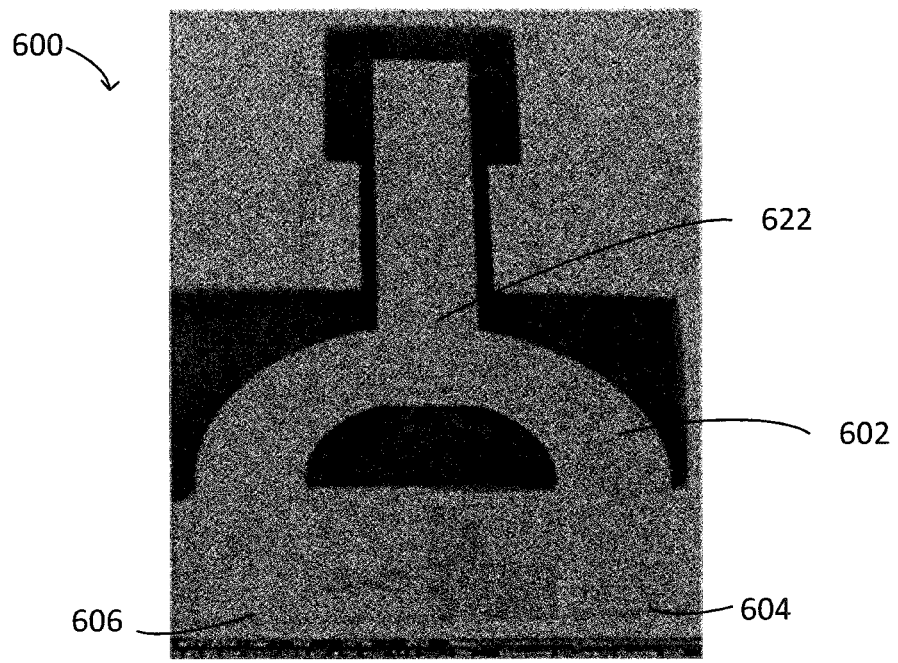
FIGS. 9F and 9G show SEM images of a prototype of the curved-anchor energy harvester of FIG. 9A before and after fracture, respectively.
Figure 9G:
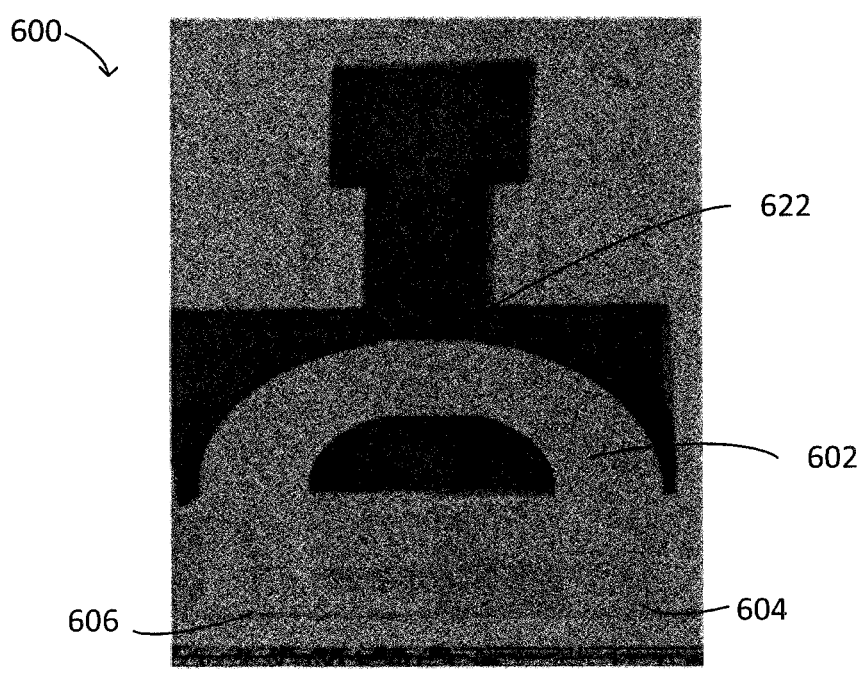

The durability and reliability of the curved-anchor energy harvester 600 was measured experimentally. In particular, the depicted 3-D structural diagram of the harvester 600 in FIG. 9A was fabricated using the micro-fabrication process described herein with respect to FIGS. 5A-5F. As shown in FIG. 9F, the prototype curved-anchor energy harvester 600 is shown with a SEM image. In this regard, the prototyped harvester 600 was excited for a relatively long duration time (e.g. about 2 hours) with an extensively large amplitude of acceleration (e.g. about 3 g). As shown in FIG. 9G, the SEM image of the tested harvester after its fracture. It can be seen that the fatigue lifetime damage only occurred in the area 622 above the curve-shaped anchor 602, which is consistent with the conducted FEM simulation shown in FIG. 9D.

The performance of a prototype of the multimode energy harvester was measured experimentally. In particular, the optimized harvester, OPT2 was fabricated using the microfabrication process described herein with respect to FIGS. 5A-5F. An Image of the prototyped energy harvester is shown in FIG. 10A. The frequency response of the prototyped energy harvester in terms of deflection and harvested voltage was measured by using an experimental setup 900 which is shown in FIG. 10B and is now described. The prototype energy harvester 921 was excited by using a mechanical shaker 913 (Type 4809 manufactured by Brüel & Kjær), whose vibration frequency and magnitude were controlled by a function generator 903 (Agilent 3250) and amplified by a high power amplifier 905 (manufactured by Brüel & Kjær). The shaker acceleration amplitude was monitored by an accelerometer 911 (DXL 3350 manufactured by Analog Devices), which was attached to the shaker platform. Laser displacement sensors 909 (LK-H022 manufactured by Keyence) were mounted on a mounting system 907 on top of the harvester 921 to measure the deflection of the proof masses along the z-axis over time while the prototype energy harvester 921 was excited. The velocity of the proof masses can be determined by using a ratio between the measured deflection and the spent time. The generated voltage by the prototype MEMS piezoelectric harvester 921 was measured by using a high performance oscilloscope 901 (DSA 7040 manufactured by Tektronix) through a high impedance probe.

Figure 11:
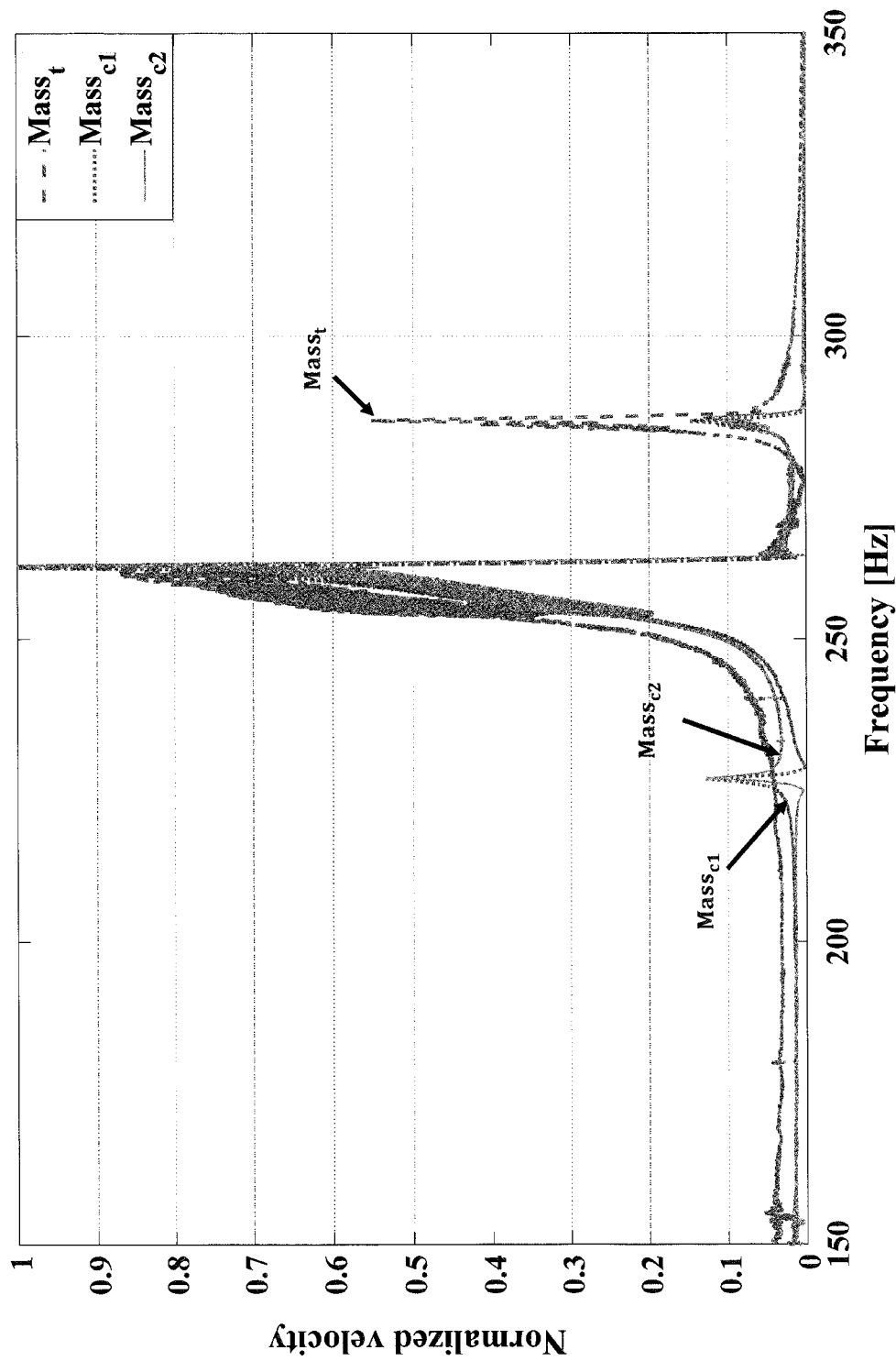
FIG. 11 illustrates experimental measurement of the velocity spectrum of the micro-fabricated energy harvester.

Referring now to FIG. 11, shown therein is experimental measurement of frequency spectrum of the prototype energy harvester 921. The velocity of each mass, i.e. $Mass_t$, $Mass_{c1}$ and $Mass_{c2}$, was measured by sweeping the operation frequency of the shaker 913 in range of 150 Hz-350 Hz, and using the laser displacement sensor 909. The first three peak velocities, which represent the first three resonant frequency modes of the prototype energy harvester 921, are observed at 227 Hz, 261.8 Hz and 286 Hz, respectively. Observing three resonant frequency modes in the vicinity of each other confirms that the structure of the piezoelectric MEMS vibration energy harvesters described herein has MDOF behavior. The maximum deflection was seen at the second mode and the center mass $Mass_t$ did not experience any oscillation at the first mode; however, its velocity magnitude at the third mode is considerable compared to the magnitude of the other masses that are located at the corners (i.e. $Mass_{c1}$ and $Mass_{c2}$).

It is worth noting that this measured performance using a physical prototype matches the simulated findings obtained by performing the FEM simulation. For example, the discrepancy among the numerical and experimental results for the higher order mode (i.e. the third mode) is less than 2%. Therefore, a comparison between the numerical (i.e. FIG. 6) and experimental (i.e. FIG. 11) frequency spectrums, validates the accuracy of the FEM model.

Figure 12A:
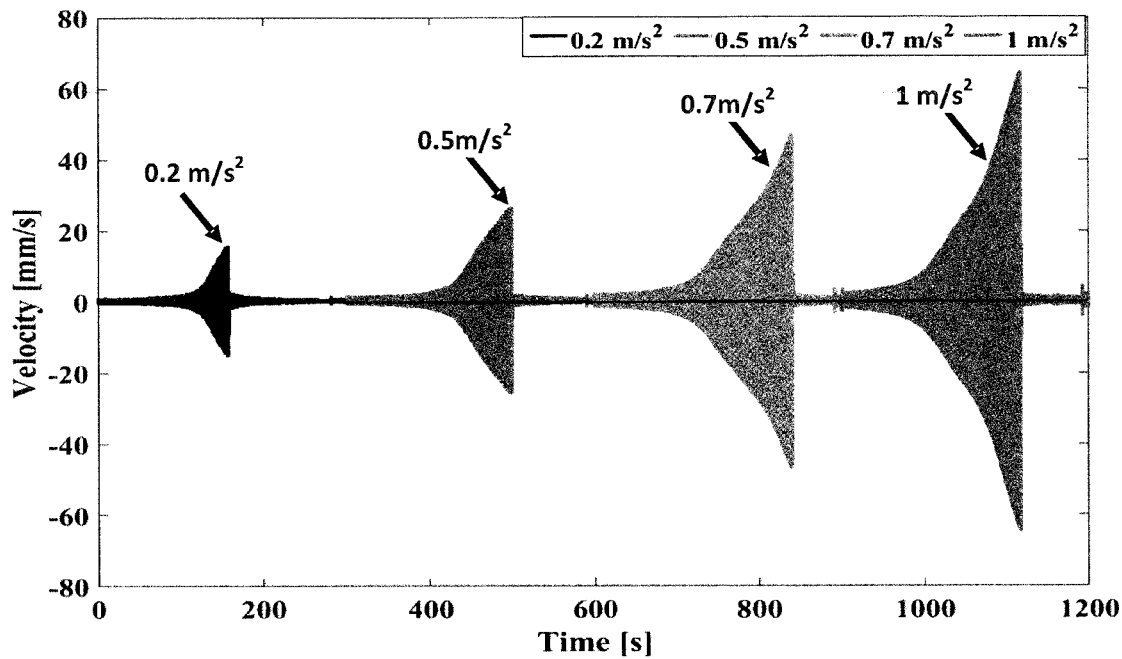
FIGS. 12A-12B show measured velocity of the assigned proof mass at the center (i.e. $Mass_c$) for an example embodiment of the energy harvester while it was excited by forward frequency sweeping at the second mode, where the data is shown in the time domain (FIG. 12A) and in the frequency domain (FIG. 12B).
Figure 12B:
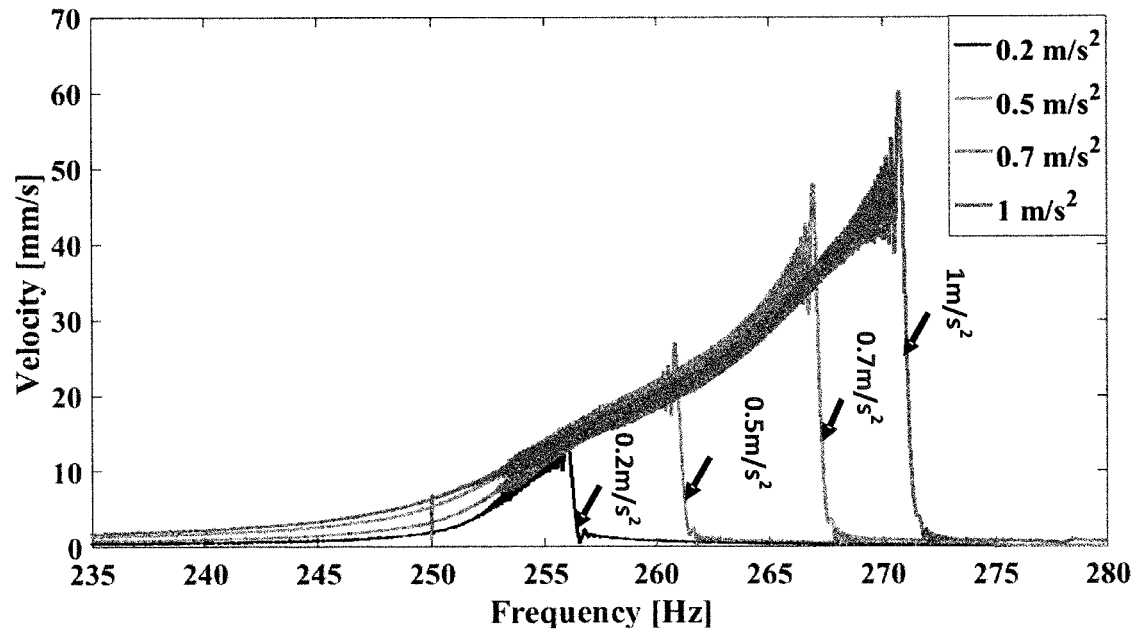

Furthermore, according to the illustrated frequency spectrum in FIG. 11, it can be observed that at the second mode of the prototype energy harvester 921 is highly nonlinear, due to jump phenomenon behavior [18]. This nonlinear response was investigated under different magnitudes of acceleration. In FIG. 12A, by forward frequency sweeping, the Mass, velocity response in time domain, under acceleration of 0.2 m/s², 0.5 m/s², 0.7 m/s² and 1 m/s² is shown. Moreover, to demonstrate its response in frequency domain, from the recorded data in the time domain their Fast Fourier Transforms (FFTs) were computed using MATLAB and are presented in FIG. 12B. Once the prototype harvester 921 was excited with a quite small acceleration amplitude (i.e. 0.2 m/s²), its nonlinearity was observed through a jump phenomenon, due to the geometric stiffness hardening, at 257 Hz (black curve). By increasing the acceleration amplitude to 1 m/s², the jump phenomenon shifted to 271 Hz. That is to say, the nonlinear behaviour of the prototype energy harvester 921 is obtainable even if the amplitude of excitation is significantly small, since for acceleration with magnitude of 0.2 m/s², the nonlinearity due to geometric stiffness hardening was clearly observed [19].

However, it should not be ignored that increasing the acceleration amplitude can enlarge the operational bandwidth of the energy harvester considerably. In order to compare the obtained frequency spectrum under different excitation amplitudes, the operational bandwidth was defined as a range of frequency responses for which at least 20% of the maximum response can be achieved. In the second mode when the prototype energy harvester was under excitation, vibration acceleration of 0.2 m/s², 0.5 m/s², 0.7 m/s² and 1 m/s² at bandwidth of 5.3 Hz, 9.8 Hz, 14 Hz and 16 Hz, respectively, were achieved. It should be taken into consideration that such a broadband operational bandwidth may not require relatively large magnitude of acceleration. For instance, an operational bandwidth of 16 Hz is reached when the acceleration magnitude is only 1 m/s².

Figure 12C:
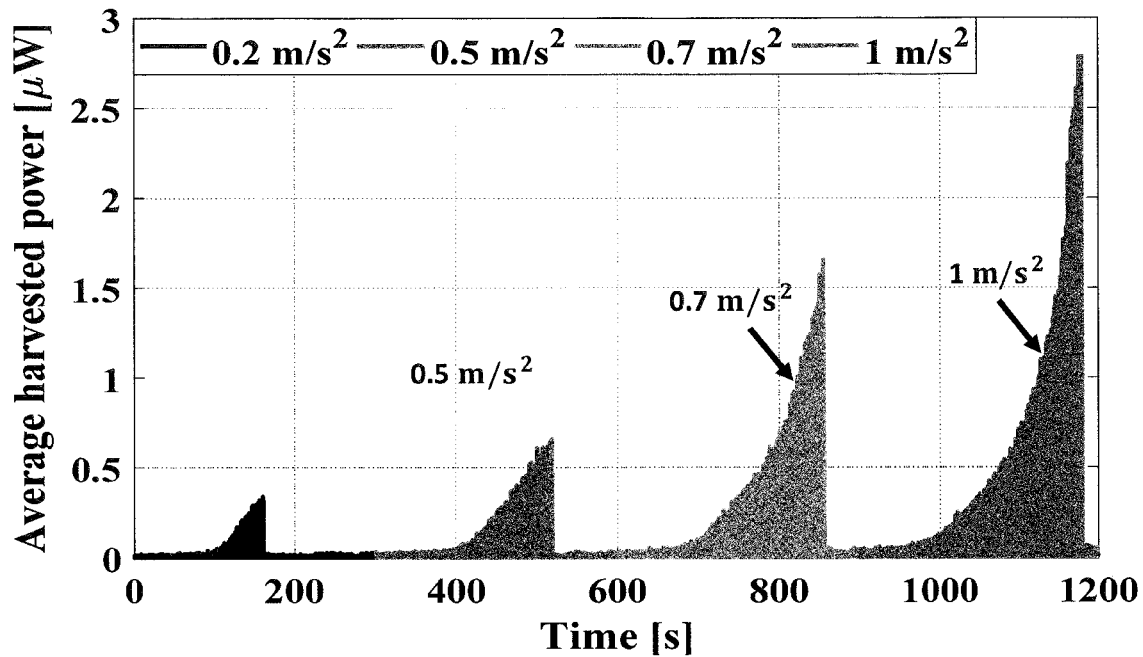
FIGS. 12C and 12D show the measured average harvested power for an example embodiment of the energy harvester while it was excited by forward frequency sweeping at the second mode, where the data is shown in the time domain (FIG. 12C) and in the frequency domain (FIG. 12D).
Figure 12D:
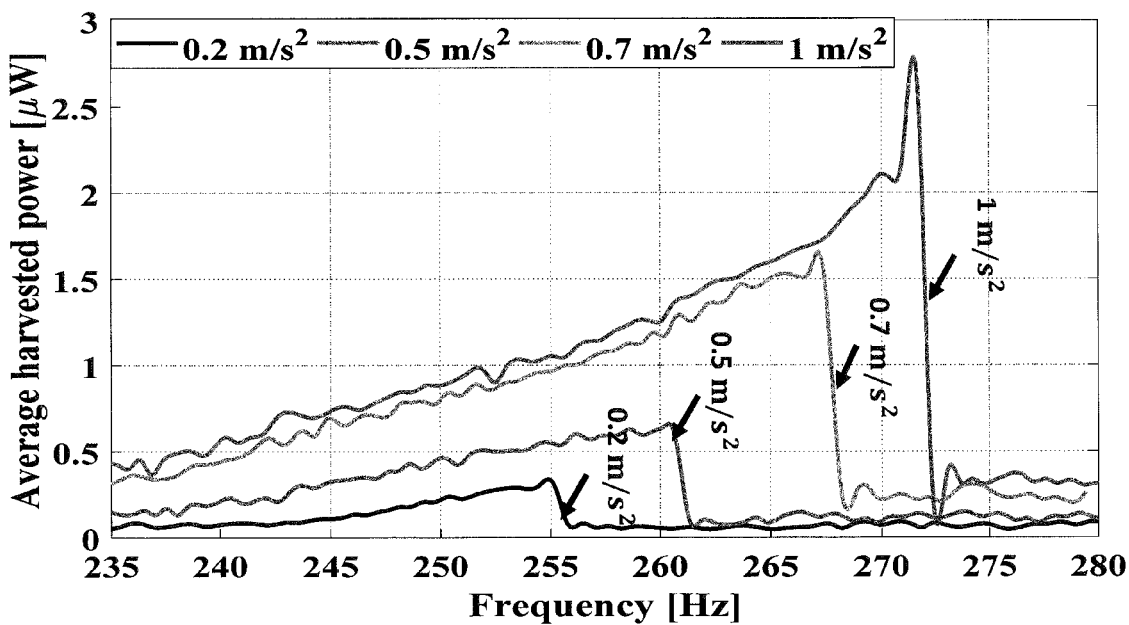

As noted previously, the piezoelectric MEMS energy harvester can act as a nonlinear mechanical resonator with higher deformation magnitude and energy conversion efficiency during its operation in the second mode. Its capability of harvesting power in this mode, at the second resonant frequency, under different levels of excitation was measured. FIGS. 12C and 12D show the measured average harvested power when the energy harvester was excited by forward frequency sweeping in the second mode. FIG. 12C shows the average harvested power by the energy harvester in the time domain under different amplitude of acceleration, while FIG. 12D depicts the average harvested power in the frequency domain. As shown by FIGS. 12C and 12D, both the average harvested power and the operational bandwidth are functions of acceleration amplitude. An increase of acceleration amplitude from 0.2 m/s2 to 1 m/s² can enlarge the average harvested power from 0.34 µW to 2.8 µW, while the operational frequency bandwidth of the device can also be increased. Accordingly, it was found that the electrical characterization in FIGS. 12C-12D is the same as the observed mechanical characterization in FIGS. 12A-12B. In particular, under the excitation of an extremely small acceleration amplitude (i.e., 0.2 m/s²), a considerable amount of the average power can be generated by the energy harvester. The nonlinearity behavior can also be observed, which makes the proposed device feature wider bandwidth for better energy harvesting.

Figure 13A:
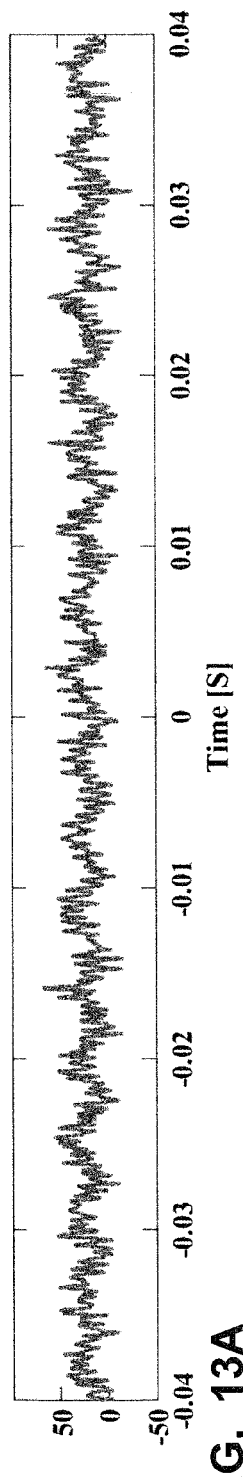
FIGS. 13A-13C show measured harvested voltage for an example embodiment of the energy harvester with acceleration of 0.5 m/s$^2$: at the first mode (i.e. 227 Hz in FIG. 12A), at the second mode (i.e. 261.8 Hz in FIG. 13B), and at the third mode (i.e. 286 Hz in FIG. 13C), respectively.
Figure 13B:
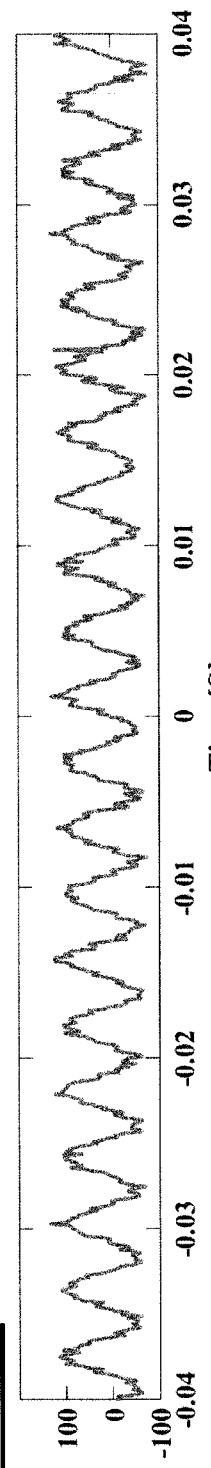
Figure 13C:
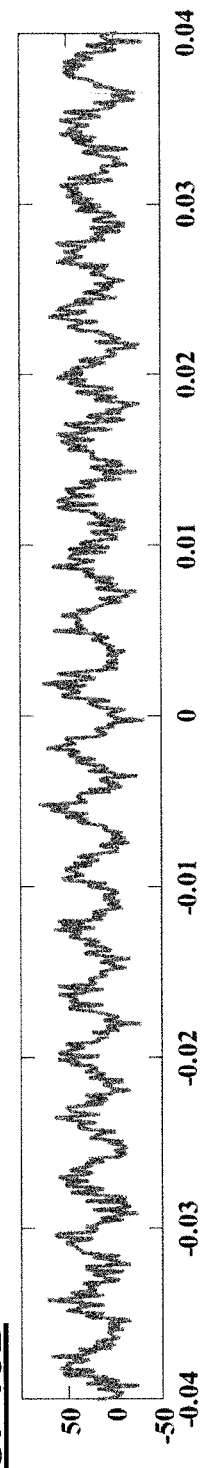

The capability of the prototyped energy harvester 921 for generating voltage was investigated by measuring the real time generated voltage. FIGS. 13A-13C illustrate the oscilloscope traces at each individual resonant frequency mode, while the prototyped energy harvester 921 was excited by a sinusoidal acceleration with a magnitude of 0.5 m/s². A comparison between the magnitude of the harvested voltages at each mode shows that once the prototyped energy harvester 921 is excited at its second mode, the maximum harvested voltage can be obtained with a 132 mV peak voltage. The peak harvested voltages are 55 mV and 76 mV at the first and third modes, respectively. While the prototyped energy harvester 921 at the third mode has a higher efficiency than at the first mode, it can be seen that the prototyped piezoelectric MEMS vibration harvester 921 can generate voltage at multimode frequencies. Furthermore, the level of the harvested voltage clearly exhibits the correctness of the strain/stress distributions, which were shown earlier by FEM simulation and the measured frequency spectrum.

In order to estimate the delivered power to a load by the prototyped piezoelectric MEMS energy harvester 921, the impedance of the harvester, which is known as a source impedance [20], was measured by an LCR meter (Model 889B manufactured by BK Precision). It was found that for the low frequencies (i.e. less than 1 KHz), the source impedance was around 3.17 kΩ. Thus, it is expected that by providing an optimal load resistance, whose value is equal to the source impedance (i.e. 3.17 kΩ), a perfect impedance matching network between the source and load parts, can be achieved. In this way, it was assumed that the load impedance was purely resistive, and therefore the average output power can be estimated by [21]:

$$P_{avg} = \frac{V_{rms}^2}{R_L} \tag{6}$$

where $V_{rms}$ is the RMS voltage measured at the output and $R_L$ denotes the optimum load resistance. Under these assumptions and formulas, it was determined that when the prototyped MEMS energy harvester 921 was excited with a sinusoidal acceleration having magnitude of 0.5 m/s², it was able to generate 0.47 µW, 2.75 µW and 0.91 µW at the first, second and third modes, respectively.

The impedance of the prototyped piezoelectric MEMS energy harvester 921 (i.e., the optimal resistive load), was also measured with an Agilent E4990A impedance analyzer manufactured by Keysight. It was found that at the second mode resonant frequency (i.e., 261.8 Hz) the source impedance was about 11.65 kΩ, and that this value remained almost the same (less than ±1% variation) for the first and third modes, respectively. Thus, it is expected that a perfect impedance matching network between the source and load can be achieved by providing an optimal load resistance, whose value is equal to the source impedance of 11.65 kΩ As described above, if it is assumed that the load impedance is purely resistive, when the prototyped MEMS energy harvester 921 is excited by a sinusoidal acceleration input with a magnitude of 0.5 m/s2, it is able to generate 0.02 µW, 0.61 µW and 0.14 µW in the first, second, and third modes, respectively. The previously described measurement technique in the previous paragraph is highly accurate and preferred.

When comparing harvester efficiency for different energy harvesters, normalized power density (NPD), which is a ratio between harvested power and volumetric size of the harvester per acceleration squared, widely utilized in the literature [22]. By considering this metric, a comparison among the properties of the prototyped energy harvester 921, such as NPD and operational frequency, and various energy harvesters in the literature was conducted and the results are shown in Table 5. According to the summarized data in Table 5, it is clear that the prototyped energy harvester 921 (last row in Table 5) is one of the most efficient piezoelectric harvesters with a considerable operational frequency. It is worth noting that the structure of the energy harvesters described in accordance with the teachings herein provides sound advantages in terms of energy efficiency in the MEMS scale, with a small occupied volume of silicon wafer, due to the serpentine structure.

TABLE 5

Comparison of properties of recent reported wideband MEMS/portable vibration energy harvesters.

| Ref. | Technique | Volume [mm$^3$] | Substrate | Accel. [m/s$^2$] | Operation frequency [Hz] | Generated Power [μW] | NPD [μW · cm$^{-3}$ m$^{-2}$s$^4$] |
|---|---|---|---|---|---|---|---|
| [23] | Electrostatic | 27.1 | Silicon | 1.372 | 520-591 | 0.083 | 1.63 |
| [24] | Electrostatic | 187 | Silicon | 0.9 | 148-172 | 4.95 | 32.68 |
| [25] | Electromagnetic | 35 | Silicon | 9.8 | 840-1490 | 0.0055 | 0.00163 |
| [26] | Electromagnetic | 43.35 | FR4 | 10 | 190-244 | 0.45 | 0.0045 |
| [27] | Piezoelectric | 112 | Silicon | 19.6 | 859.9-924.5 | 82.24 | 1.91 |
| [28] | Piezoelectric | 1419.35 | Steel | 0.392 | 4-8 | 2610 | 11969.8 |
| [29] | Piezoelectric | 6500 | Silicon | 0.5 | 387-398 | 52.9 | 32.55 |
| [30] | Piezoelectric | 10 | Silicon | 9.8 | 30-47 | 0.5 | 0.52 |
| [31] | Piezoelectric | 17.5 | Silicon | 7.84 | 12-26 | 0.87 | 0.008 |
| [18] | Piezoelectric | 18 | Silicon | 1.96 | 71.8-188.4 | 0.136 | 1.97 |
| OPT 2 | Piezoelectric | 4.1 | Silicone | 0.5 | 227-286 | 2.75 | 2682.9 |

In accordance with the teachings herein, there can be embodiments that comprise several of the energy harvesters described herein coupled to one another to form a network of energy harvesters. For example, to further increase the efficiency, several energy harvesters having similar operational characteristics can be coupled together. Alternatively, to increase the operational bandwidth, several energy harvesters having different operational bandwidths can be coupled together. Alternatively, to increase both efficiency and operational bandwidth, several energy harvesters can be coupled together where some of these energy harvesters have the same operational bandwidth and some of these energy harvesters have different operational bandwidths.

Figure 14:
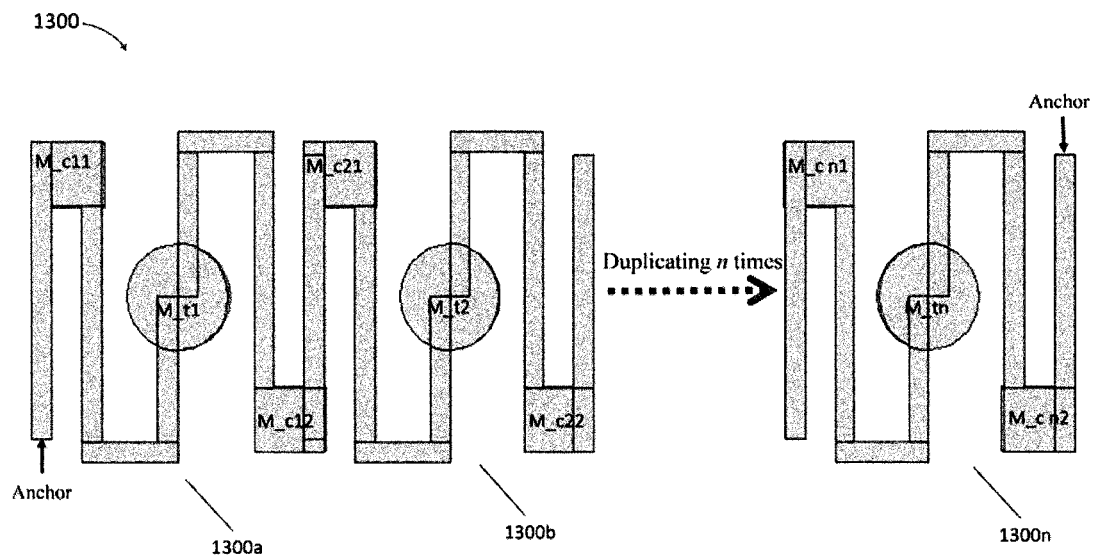
FIGS. 14-16 illustrate examples of alternative embodiments of energy harvesters in accordance with the teachings herein.

Referring now to FIG. 14, shown therein is an energy harvester 1300 according to an alternative example embodiment. The energy harvester 1300 comprises a plurality of energy harvesting stages 1300a to 1300n where each comprises a serpentine structure and a uniform proof masses distribution in accordance with the structure of the energy harvester 10. Accordingly, the energy harvester 10 can be considered to have a single energy harvesting stage. In the energy harvester 1300, each energy harvesting stage is coupled to an adjacent energy harvesting stage in a side-by-side (i.e. serial) fashion in the horizontal direction such that the last beam of one energy harvesting stage is shared with the first beam of a subsequent energy harvesting stage. Therefore, the overall length of the energy harvester 1300 is increased compared to the single-stage energy harvester 10. Accordingly, with the energy harvester 1300, the pattern for an individual energy harvester is duplicated and the cantilevers from separate, adjacent energy harvesting stages are coupled together. Furthermore, the end of the first beam of the first energy harvesting stage (i.e. the leftmost energy harvester stage 1300a) and the end of the last beam of the last energy harvesting stage (i.e. the rightmost energy harvester stage 1300n) are anchored. It should be noted that the proof masses can be different for each of the different energy harvester stages shown in FIG. 14.

Figure 15:
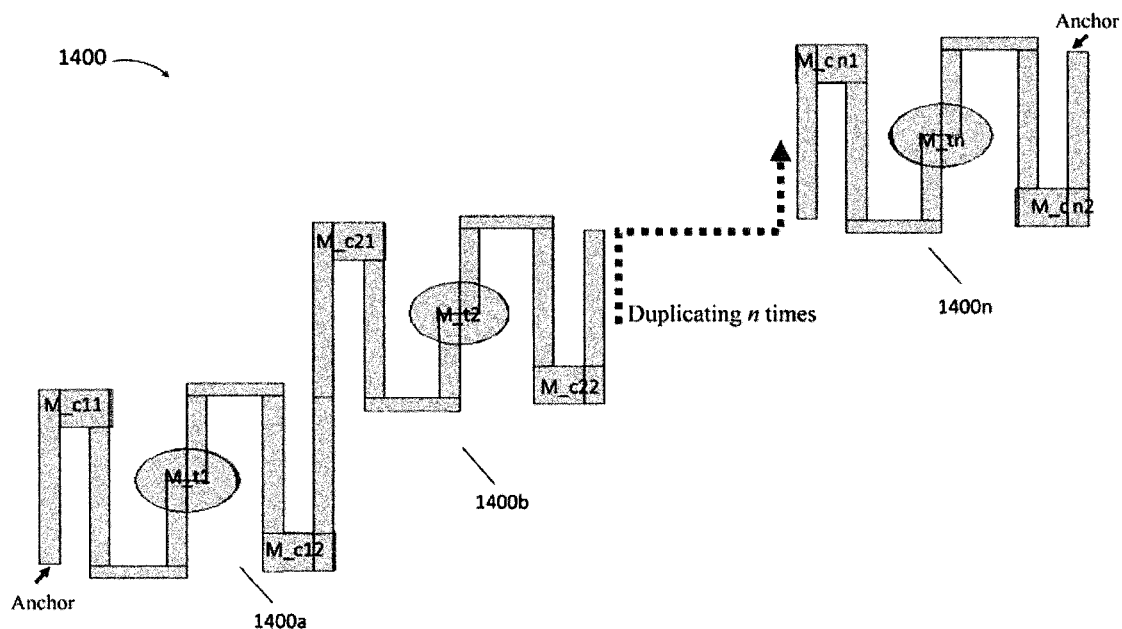

Referring now to FIG. 15, shown therein is an energy harvester 1400 according to another alternative example embodiment. The energy harvester 1400 also comprises a plurality of energy harvesting stages 1400a to 1400n where each comprises a serpentine structure and a uniform proof masses distribution in accordance with the structure of the energy harvester 10. However, adjacent energy harvesting stages are coupled both in the horizontal and vertical directions such that the rightmost tip of a given energy harvester stage is coupled to the leftmost tip of a subsequent energy harvester stage. Furthermore, the end of the first beam of the first energy harvesting stage (i.e. the leftmost energy harvester stage 1400a) and the end of the last beam of the last energy harvesting stage (i.e. the rightmost energy harvester stage 1400n) are anchored. Accordingly, adjacent energy harvesting stages are diagonally located with respect to one another. Therefore, the energy harvester 1400 has an overall length and width that is increased compared to the single-stage energy harvester 10. It should be noted that the proof masses can be different for each of the different energy harvester stages shown in FIG. 15.

Figure 16:
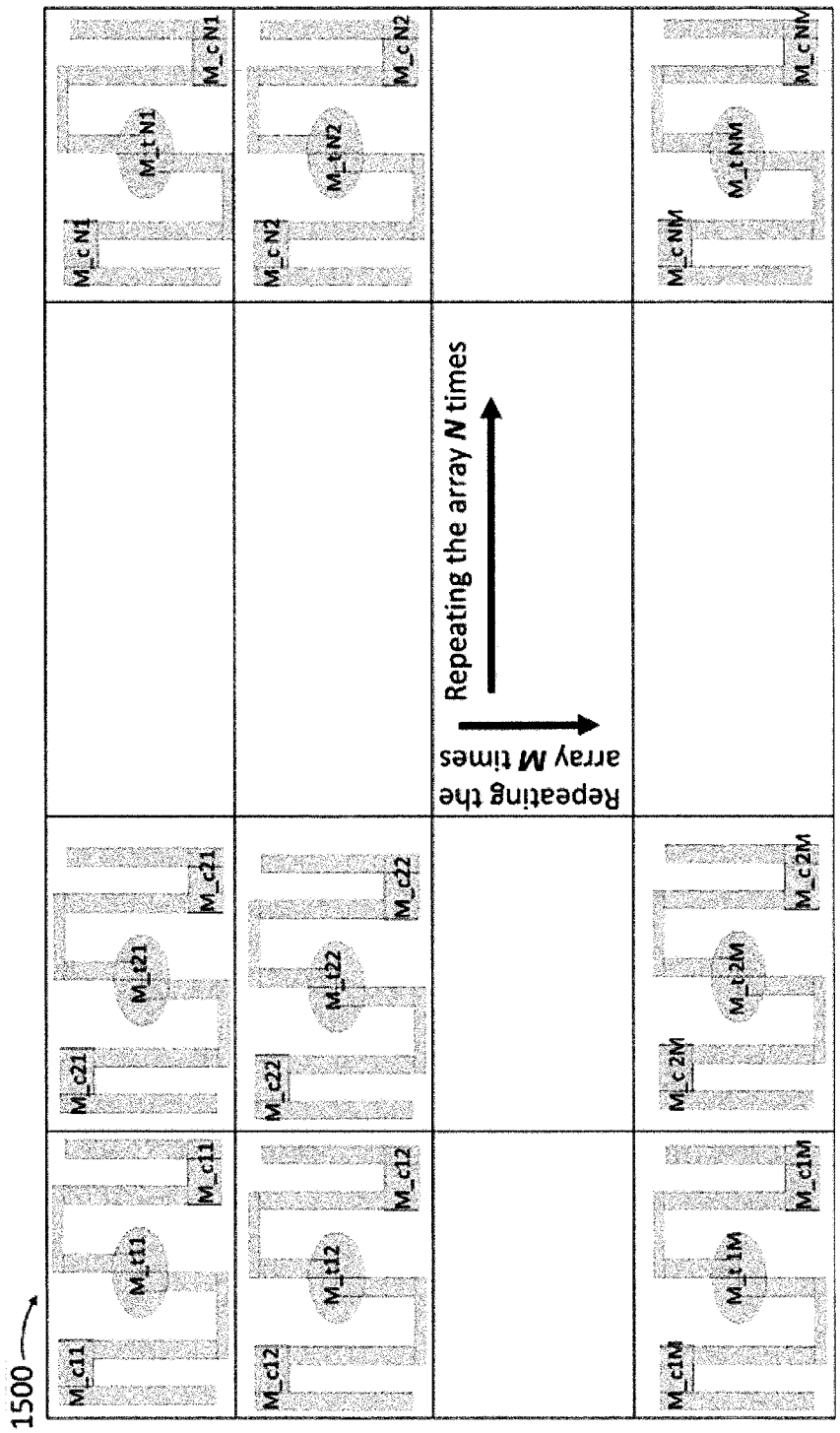

Referring now to FIG. 16, shown therein is an energy harvester 1500 according to another alternative example embodiment, which is in the form of a two-dimensional M×N array. For example, multiple energy harvester devices 1500 with different resonant frequencies can be placed on a chip in a two dimensional array configuration. For example, this alternative embodiment can be considered as a technique for enlarging operational frequency bandwidth of the entire packaged harvester. These harvesters are not connected together, which means their performances are not dependent on one another. In this proposed array form, several standalone energy harvesters, as shown in FIG. 1A, are placed in a single package and can be independently used depending on the energy requirements of the particular application in which this embodiment is used.

In accordance with the teachings herein, a structure is provided that is capable of multiple degrees of freedom for widening the operational bandwidth of the piezoelectric MEMS vibration energy harvester. For example, the structure has an eccentric geometry comprising a doubly clamped piezoelectric cantilever with a serpentine shape and three proof masses located at different positions to provide a 180 degree rotational symmetry about the center mass, in contrast with the conventional harvesters, which generally include a straight cantilever along with a single proof mass at the end. By modal analysis and mechanical stiffness computations, it is shown that the energy harvester is able to operate at multiples modes with a strong nonlinear behavior at its second resonant frequency mode.

Since the energy harvesters described herein have an eccentric geometry with nonlinear behaviour, conventional optimization methodologies are not used but rather a Genetic Algorithm (GA)-based optimization method, which is modified in accordance with the teachings herein, can be used to select values for certain structural features of the energy harvester in order to optimize its performance. The GA method can be performed automatically with minimal human effort once certain constraints are set for the algorithm. The optimization results show that the GA-based optimization methodology can provide values for certain structural parameters of the energy harvester, which reduces the operational frequency, and brings the modes (i.e. resonant frequencies) closer together which widens the operational bandwidth. This was verified through FEM-based simulations and testing of a fabricated prototype, as described herein, which had a first mode at 227 Hz, a second mode at 261.8 Hz and a third mode at 286 Hz. The prototyped energy harvester also exhibited nonlinearity at its second mode and the jump phenomenon, due to the geometric stiffness hardening, was recognizable even with extremely small magnitude of base excitation (i.e. 0.2 m/s$^2$). The normalized power density of the prototype harvester was also determined and found to be superior to that of reported MEMS harvesters in the literature as shown in Table 5.

It should be noted that while the focus of the MEMS structures shown and described herein have been for energy harvesting, these structures can also be used to provide a MEMS resonator.

While the applicant's teachings described herein are in conjunction with various embodiments for illustrative purposes, it is not intended that the applicant's teachings be limited to such embodiments as the embodiments described herein are intended to be examples. On the contrary, the applicant's teachings described and illustrated herein encompass various alternatives, modifications, and equivalents, without departing from the embodiments described herein, the general scope of which is defined in the appended claims.

REFERENCES

[1] L. Zhao, L. Tang, J. Liang, and Y. Yang, "Synergy of wind energy harvesting and synchronized switch harvesting interface circuit," IEEE/ASME Trans. Mechatronics, vol. 22, no. 2, pp. 1093-1103, 2017.

[2] Y. Song, C. H. Yang, S. K. Hong, S. J. Hwang, J. H. Kim, J. Y. Choi, S. K. Ryu, and T. H. Sung, "Road energy harvester designed as a macro-power source using the piezoelectric effect," Int. J. Hydrogen Energy, vol. 41, no. 29, pp. 12563-12568, 2016.

[3] M. Geisler, S. Boisseau, M. Perez, P. Gasnier, J. Willemin, I. Ait-Ali, and S. Perraud., "Human-motion energy harvester for autonomous body area sensors," Smart Mater. Struct., vol. 26, no. 3, p. 35028, 2017.

[4] S. Nabavi and L. Zhang, "Portable Wind Energy Harvesters for Low-Power Applications: A Survey," Sensors, vol. 16, no. 7, p. 1101, 2016.

[5] Q. Wang, Y. Lu, S. Mishin, Y. Oshmyansky, and D. A. Horsley, "Design, Fabrication, and Characterization of Scandium Aluminum Nitride-Based Piezoelectric Micromachined Ultrasonic Transducers," J. Microelectromechanical Syst., vol. 26, no. 5, pp. 1132-1139, 2017.

[6] H. S. Kim, J.-H. Kim, and J. Kim, "A review of piezoelectric energy harvesting based on vibration," Int. J. Precis. Eng. Manuf., vol. 12, no. 6, pp. 1129-1141, 2011.

[7] A. Abdelkefi, N. Barsallo, L. Tang, Y. Yang, and M. R. Hajj, "Modeling, validation, and performance of low-frequency piezoelectric energy harvesters," J. Intell. Mater. Syst. Struct., vol. 25, no. 12, pp. 1429-1444, 2014.

[8] S. Sunithamani, P. Lakshmi, and E. E. Flora, "PZT length optimization of MEMS piezoelectric energy harvester with a non-traditional cross section: simulation study," Microsyst. Technol., vol. 20, no. 12, pp. 2165-2171, 2014.

[9] G. Sordo, E. Serra, U. Schmid, and J. Iannacci, "Optimization method for designing multimodal piezoelectric MEMS energy harvesters," Microsyst. Technol., vol. 22, no. 7, pp. 1811-1820, 2016.

[10] S. D. Senturia, Microsystem design. Springer Science & Business Media, 2007.

[11] W. Zhang, R. Baskaran, and K. L. Turner, "Effect of cubic nonlinearity on auto-parametrically amplified resonant MEMS mass sensor," Sensors Actuators A Phys., vol. 102, no. 1, pp. 139-150, 2002.

[12] K. Deb and H. Jain, "An evolutionary many-objective optimization algorithm using reference-point-based non-dominated sorting approach, part I: Solving problems with box constraints.," IEEE Trans. Evol. Comput., vol. 18, no. 4, pp. 577-601, 2014.

[13] L. Davis, "Handbook of genetic algorithms," 1991.

[14] A. H. Meitzler, H. F. Tiersten, A. W. Warner, D. Berlincourt, G. A. Couqin, and F. S. Welsh III, "IEEE standard on piezoelectricity." Society, 1988.

[15] N. Chidambaram, A. Mazzalai, and P. Muralt, "Measurement of effective piezoelectric coefficients of PZT thin films for energy harvesting application with inter-digitated electrodes," IEEE Trans. Ultrason. Ferroelectr. Freq. Control, vol. 59, no. 8, pp. 1624-1631, 2012.

[16] J.-H. Park, M. S. Myung, and Y.-J. Kim, "Tensile and high cycle fatigue test of Al—3% Ti thin films," Sensors Actuators A Phys., vol. 147, no. 2, pp. 561-569, 2008.

[17] "COMSOL Fatigue Module." [Online]. Available: https://www.comsol.com/fatigue-module. [Accessed: 10 Jun. 2018].

[18] M. Rezaeisaray, "Investigation of Potential Platforms for Low Frequency MEMS-based Piezoelectric Energy Harvesting,", PhD thesis, University of Alberta, 2014.

[19] A. Cammarano, S. A. Neild, S. G. Burrow, and D. J. Inman, "The bandwidth of optimized nonlinear vibration-based energy harvesters," Smart Mater. Struct., vol. 23, no. 5, p. 55019, 2014.

[20] N. A. Kong, D. S. Ha, A. Erturk, and D. J. Inman, "Resistive impedance matching circuit for piezoelectric energy harvesting," J. Intell. Mater. Syst. Struct., 2010.

[21] S. B. Horowitz, M. Sheplak, L. N. Cattafesta III, and T. Nishida, "A MEMS acoustic energy harvester," J. Micromechanics Microengineering, vol. 16, no. 9, p. S174, 2006.

[22] H.-C. Song, P. Kumar, D. Maurya, M. Kang, W. T. Reynolds, D. Jeong, C. Y. Kang, and S. Priya, "Ultra-Low Resonant Piezoelectric MEMS Energy Harvester With High Power Density," J. Microelectromechanical Syst., vol. 26, no. 6, pp. 1226-1234, 2017.

[23] D. S. Nguyen, E. Halvorsen, G. U. Jensen, and A. Vogl, "Fabrication and characterization of a wideband MEMS energy harvester utilizing nonlinear springs," J. Micromechanics Microengineering, vol. 20, no. 12, p. 125009, 2010.

[24] Y. Zhang, T. Wang, A. Luo, Y. Hu, X. Li, and F. Wang, "Micro electrostatic energy harvester with both broad bandwidth and high normalized power density," *Appl. Energy*, vol. 212, pp. 362-371, 2018.

[25] H. Liu, Y. Qian, and C. Lee, "A multi-frequency vibration-based MEMS electromagnetic energy harvesting device," *Sensors Actuators A Phys.*, vol. 204, pp. 37-43, 2013.

[26] D. Mallick, A. Amann, and S. Roy, "A nonlinear stretching based electromagnetic energy harvester on FR4 for wideband operation," *Smart Mater. Struct.*, vol. 24, no. 1, p. 15013, 2014.

[27] N. Wang, C. Sun, L. Y. Siow, H. Ji, P. Chang, Q. Zhang, and Y. Gu., "AlN wideband energy harvesters with wafer-level vacuum packaging utilizing three-wafer bonding," in *Proc. IEEE 30th Micro Electro Mechanical Systems (MEMS)*, 2017, 2017, pp. 841-844.

[28] S. Leadenham and A. Erturk, "Nonlinear M-shaped broadband piezoelectric energy harvester for very low base accelerations: primary and secondary resonances," *Smart Mater. Struct.*, vol. 24, no. 5, p. 55021, 2015.

[29] E. E. Aktakka and K. Najafi, "Three-axis piezoelectric vibration energy harvester," in *Proc. IEEE 28th Micro Electro Mechanical Systems (MEMS)*, 2015, pp. 1141-1144.

[30] H. Liu, C. J. Tay, C. Quan, T. Kobayashi, and C. Lee, "Piezoelectric MEMS energy harvester for low-frequency vibrations with wideband operation range and steadily increased output power," *Microelectromechanical Syst. J.*, vol. 20, no. 5, pp. 1131-1142, 2011.

[31] H. Liu, C. Lee, T. Kobayashi, C. J. Tay, and C. Quan, "Piezoelectric MEMS-based wideband energy harvesting systems using a frequency-up-conversion cantilever stopper," *Sensors Actuators A Phys.*, vol. 186, pp. 242-248, 2012.

[32] M. Rezaeisaray, M. El Gowini, D. Sameoto, D. Raboud, and W. Moussa, "Low frequency piezoelectric energy harvesting at multi vibration mode shapes," *Sensors Actuators A Phys.*, vol. 228, pp. 104-111, 2015.

The invention claimed is:

1. An energy harvester comprising:
at least one energy harvester stage, where each energy harvester stage comprises:
  a serpentine structure having:
    a mid-portion having a longitudinal axis;
    a first serpentine portion extending from a first end of the mid-portion of the serpentine structure; and
    a second serpentine portion extending from a second end of the mid-portion of the serpentine structure,
    the first and second serpentine portions comprising a plurality of beams where sequential beams have varying lengths and/or orientations;
  a center mass disposed at a central region of the mid-portion of the serpentine structure;
  a first lateral mass disposed in the first serpentine portion;
  a second lateral mass disposed in the second serpentine portion;
  a layer of piezoelectric material deposited on a surface of the serpentine structure; and
  top and bottom electrode layers for harvesting the generated voltage, the top electrode layer comprising a plurality of upper electrodes located at different sections of the top electrode layer and covering a majority of the top electrode layer without overlapping to increase energy generated by the energy harvester, wherein, during use, when a section of the serpentine structure experiences a strain, the piezoelectric layer at the section generates a voltage.

2. The energy harvester of claim 1, wherein the top electrode layer comprises a first upper electrode covering a first half of the serpentine structure and a second upper electrode covering a second half of the serpentine structure, the first and second upper electrodes being positioned to increase energy generated by the energy harvester.

3. The energy harvester of claim 1, wherein the top electrode layer comprises a center upper electrode covering the mid-portion of the serpentine structure and adjacent portions of the first and second serpentine portions, a rightmost upper electrode adjacent to the center electrode and covering a remaining portion of the first serpentine structure, and a leftmost electrode adjacent to the center electrode and covering a remaining portion of the second serpentine structure, the center, rightmost and leftmost upper electrodes being positioned to increase energy generated by the energy harvester by enlarging the internal impedance of the energy harvester and minimizing voltage cancelation along each cantilever of the energy harvester.

4. The energy harvester of claim 1, wherein the top electrode layer comprises six upper electrodes including top and bottom center upper electrodes covering top and bottom mid-portions of the serpentine structure, first and second leftmost upper electrodes adjacent to one another and the bottom center upper electrode and covering a remaining portion of the first second serpentine portion, and first and second rightmost upper electrodes adjacent to one another and the top center upper electrode and covering a remaining portion of the second serpentine structure, the upper electrodes being positioned to increase energy generated by the energy harvester by enlarging the internal impedance of the energy harvester and minimizing voltage cancelation along each cantilever of the energy harvester.

5. The energy harvester of claim 1, wherein the first and second lateral masses are disposed at first and second sides of the first and second serpentine portions about the center mass to provide a uniform mass distribution.

6. The energy harvester of claim 1, wherein the serpentine structure has two ends that provide first and second anchors at first and second opposite corners of the serpentine structure, the first and second lateral masses are positioned at third and fourth opposite corners of the serpentine structure and the first and second lateral masses are coupled to the first and second anchors with first and second beams, respectively.

7. The energy harvester of claim 1, wherein the first and second serpentine portions along with first and second lateral masses have a 180 degree rotational symmetry about the center mass.

8. The energy harvester of claim 1, wherein the beams and piezoelectric material provide piezoelectric cantilevers for the energy harvester.

9. The energy harvester of claim 1, wherein the beams have a uniform width in the serpentine structure.

10. The energy harvester of claim 1, wherein the beams of the mid-portion of the serpentine structure are coupled to opposite sides of the center mass and have a smaller width than the diameter of the center mass.

11. The energy harvester of claim 1, wherein the layer of piezoelectric material is isotropic.

12. The energy harvester of claim 1, wherein the distance from the first and second lateral masses to their corresponding anchor points and the size of the first and second lateral masses are selected to reduce the operational frequency of the energy harvester and increase the operational bandwidth of the energy harvester.

13. The energy harvester of claim 1, wherein the energy harvester comprises a plurality of energy harvester stages that are coupled sequentially and disposed in a horizontal configuration, a vertical configuration or a diagonal configuration.

14. The energy harvester of claim 1, wherein the energy harvester comprises a plurality of energy harvester stages disposed in a two dimensional array configuration.

15. A method of fabricating an energy harvester, wherein the method comprises:
doping a wafer with a phosphosilicate glass layer;
annealing the wafer to drive the phosphosilicate glass layer into a top surface of the wafer;
removing the phosphosilicate glass layer;
depositing an aluminum nitride layer on the top surface of the wafer;
depositing a metal composite on top of the aluminum nitride layer;
applying a protection material on a side of the wafer; and
patterning the wafer to define a serpentine structure, masses and top electrode layer as defined according to claim 1.

16. The method of claim 15, wherein the wafer comprises a bottom oxide layer, a substrate layer disposed above the bottom oxide layer, a second oxide layer disposed above the substrate layer and a silicon layer disposed above the substrate layer.

17. The method of claim 16, wherein the method further comprises applying the protection material on a top surface of the silicon layer of the wafer.

18. The method of claim 15, wherein the act of doping comprises depositing the phosphosilicate glass layer on a top surface of the wafer.

19. The method of claim 15, wherein the method further comprises:
etching the wafer using Reactive Ion Etching (RIE) or Deep Reactive Ion Etch (DRIE); and
removing a bottom layer of the wafer.

20. The method of claim 15, wherein the act of annealing the wafer comprises heating the wafer at 1050 degrees Celsius.

21. The method of claim 15, wherein the act of annealing the wafer comprises heating the wafer for about 30 minutes to about 2 hours.

22. The method of claim 15, wherein the act of annealing the wafer comprises heating the wafer in argon gas.

23. The method of claim 15, wherein the act of removing the phosphosilicate glass layer is performed by wet chemical etching.

24. The method of claim 15, wherein the act of depositing the aluminum nitride layer is performed by reactive sputtering.

25. The method of claim 15, wherein the method further comprises:
patterning the aluminum nitride layer;
etching the patterned aluminum nitride layer; and
applying a solvent resist strip on the etched aluminum nitride layer.

26. The method of claim 15, wherein the metal composite layer comprises chrome and aluminum.

27. The method of claim 26, wherein the metal composite layer comprises about 20 nm of chrome and about 1 µm of aluminum.

28. The method of claim 15, further comprising patterning the metal composite layer on top of the aluminum nitride layer through a liftoff process.

29. The method of claim 15, further comprising patterning a plurality of electrodes on the top electrode layer.

30. The method of claim 15, further comprising:
selecting a plurality of desired resonant mode frequencies;
selecting at least one design constraint; and
using a genetic algorithm to optimize two parameters including an anchored beam length which is a distance from two corner masses to their corresponding anchors, and a length of the two corner masses to reduce values of the desired resonant mode frequencies and to reduce a frequency range between adjacent desired resonant mode frequencies.

31. An energy harvester comprising:
a serpentine structure having a central longitudinal axis;
a piezoelectric film deposited on a surface of the serpentine structure;
a central mass located at a mid-portion of the central longitudinal axis;
first and second lateral masses positioned at first and second opposing corners of the serpentine structure;
first and second anchors at third and fourth opposing corners of the serpentine structure, at least one of the anchors being coupled to a curved anchor, the curved anchor comprising an curved region and one of the ends of the curved region is coupled to the at least one anchor; and
upper and lower electrode layers, the upper electrode layer comprising a plurality of electrodes,
wherein the energy harvester has a 180 degree rotational symmetry about the central mass and
when the serpentine structure experiences a stress, the piezoelectric film generates a voltage.

32. The energy harvester of claim 31, wherein the piezoelectric material comprises aluminum nitride (AlN).

33. The energy harvester of claim 32, wherein the AlN in the piezoelectric material has a thickness of about 0.5 µm.

34. The energy harvester of claim 32, wherein the harvester comprises a metal composite, which comprises chrome and aluminum, on top of the AlN.

35. The energy harvester of claim 32, wherein the serpentine structure comprises a doubly clamped piezoelectric cantilever.

36. The energy harvester of claim 6, wherein at least one of the anchors is coupled to a curved anchor, the curved anchor comprising an curved region and one of the ends of the curved region is coupled to the at least one anchor.

37. The energy harvester of claim 31, wherein the curved anchor further comprises an anchor proof mass.

38. The energy harvester of claim 37, wherein the anchor proof mass is located at a central region of the curved anchor.

39. The energy harvester of claim 1, wherein the piezoelectric material comprises aluminum nitride (AlN).

40. The energy harvester of claim 39, wherein the harvester comprises a metal composite, which comprises chrome and aluminum, on top of the AlN.

41. The energy harvester of claim 39, wherein the serpentine structure comprises a doubly clamped piezoelectric cantilever.

* * * * *